(12) United States Patent
Ishikawa

(10) Patent No.: US 7,408,193 B2
(45) Date of Patent: Aug. 5, 2008

(54) SEMICONDUCTOR DEVICE AND MANUFACTURING METHOD THEREOF

(75) Inventor: Akira Ishikawa, Kanagawa-Ken (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/530,353

(22) Filed: Sep. 8, 2006

(65) Prior Publication Data
US 2007/0018164 A1    Jan. 25, 2007

Related U.S. Application Data

(62) Division of application No. 10/728,903, filed on Dec. 8, 2003, now Pat. No. 7,109,071, and a division of application No. 09/951,384, filed on Sep. 14, 2001, now Pat. No. 6,682,963.

(30) Foreign Application Priority Data

Sep. 14, 2000   (JP)   ............... 2000-280864
Sep. 14, 2000   (JP)   ............... 2000-280902

(51) Int. Cl.
*H01L 29/10* (2006.01)
(52) U.S. Cl. ............... 257/59; 257/67; 257/72; 257/E23.016; 257/E27.025
(58) Field of Classification Search ............ 257/59, 257/60, 72, E29.117, E29.118, E27.026, 257/E23.016, E27.025, 67
See application file for complete search history.

(56) References Cited

U.S. PATENT DOCUMENTS

| 5,166,556 A | 11/1992 | Hsu |
| 5,189,500 A * | 2/1993 | Kusunoki ............... 349/17 |
| 5,206,749 A | 4/1993 | Zavracky |

(Continued)

FOREIGN PATENT DOCUMENTS

EP    1 028 469    8/2000

(Continued)

OTHER PUBLICATIONS

Australian Patent Office Communication—Search Report (Singapore Patent Application No. 200105539-1) dated Sep. 30, 2004; 4 pages.

(Continued)

*Primary Examiner*—T. N. Quach
(74) *Attorney, Agent, or Firm*—Fish & Richardson P.C.

(57) ABSTRACT

A semiconductor device packaged in three dimensions comprises a first thin film device, a second thin film device, and a third thin film device, each of the first, second, and third thin film devices comprising a first insulating film, a first electrode formed over the first insulating film, a second insulating film formed over the first electrode, first and second thin film transistors formed over the second insulating film, wherein the first thin film transistor is connected to the first electrode through a first contact hole, a third insulating film formed over the first and second thin film transistor, a second electrode formed over the third insulating film, wherein the second electrode is connected to the second thin film transistor through a second contact hole, and a fourth insulating film formed over the third insulating film and the second electrode.

14 Claims, 26 Drawing Sheets

U.S. PATENT DOCUMENTS

| | | | |
|---|---|---|---|
| 5,256,562 A | 10/1993 | Vu | |
| 5,258,325 A | 11/1993 | Spitzer | |
| 5,317,236 A | 5/1994 | Zavracky | |
| 5,331,149 A | 7/1994 | Spitzer | |
| 5,355,022 A * | 10/1994 | Sugahara et al. | 257/768 |
| 5,376,561 A | 12/1994 | Vu | |
| 5,376,979 A | 12/1994 | Zavracky | |
| 5,396,304 A | 3/1995 | Salerno | |
| 5,432,461 A | 7/1995 | Henley | |
| 5,444,557 A | 8/1995 | Spitzer | |
| 5,467,154 A | 11/1995 | Gale | |
| 5,475,514 A | 12/1995 | Salerno | |
| 5,581,385 A | 12/1996 | Spitzer | |
| 5,612,552 A | 3/1997 | Owens | |
| 5,643,826 A | 7/1997 | Ohtani | |
| 5,661,371 A | 8/1997 | Salerno | |
| 5,663,777 A | 9/1997 | Aoyama | |
| 5,666,175 A | 9/1997 | Spitzer | |
| 5,692,820 A | 12/1997 | Gale | |
| 5,705,424 A | 1/1998 | Zavracky | |
| 5,743,614 A | 4/1998 | Salerno | |
| 5,751,261 A | 5/1998 | Zavracky | |
| 5,757,456 A | 5/1998 | Yamazaki | |
| 5,766,977 A | 6/1998 | Yamazaki | |
| 5,834,327 A | 11/1998 | Yamazaki | |
| 5,861,929 A | 1/1999 | Spitzer | |
| 5,953,595 A | 9/1999 | Gosain | |
| 6,022,792 A | 2/2000 | Ishii | |
| 6,043,800 A | 3/2000 | Spitzer | |
| 6,054,370 A | 4/2000 | Doyle | |
| 6,072,445 A | 6/2000 | Spitzer | |
| 6,111,626 A | 8/2000 | Watanabe | |
| 6,127,199 A | 10/2000 | Inoue | |
| 6,133,626 A | 10/2000 | Hawke | |
| 6,258,623 B1 | 7/2001 | Moden | |
| 6,317,175 B1 | 11/2001 | Salerno | |
| 6,320,568 B1 | 11/2001 | Zavracky | |
| 6,423,614 B1 | 7/2002 | Doyle | |
| 6,424,020 B1 | 7/2002 | Vu | |
| 6,500,694 B1 | 12/2002 | Enquist | |
| 6,525,415 B2 | 2/2003 | Koyanagi | |
| 6,608,654 B2 | 8/2003 | Zavracky | |
| 6,841,813 B2 * | 1/2005 | Walker et al. | 257/278 |
| 6,964,896 B2 * | 11/2005 | Gonzalez | 438/241 |

FOREIGN PATENT DOCUMENTS

| | | |
|---|---|---|
| JP | 04-194823 | 7/1992 |

OTHER PUBLICATIONS

Supplementary Search Report (Application No. 2001-05539-1; SG5208/5209D1) dated Sep. 30, 2004.

Singapore search report (Application No. 200301419-8), dated Jan. 2, 2008.

* cited by examiner

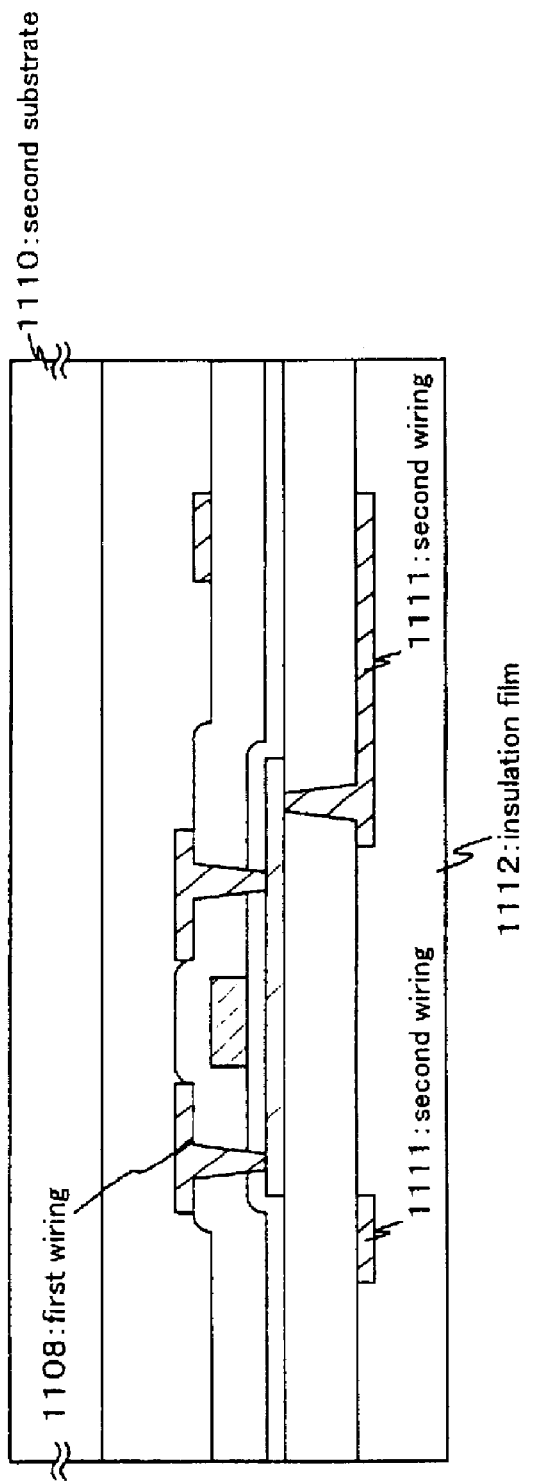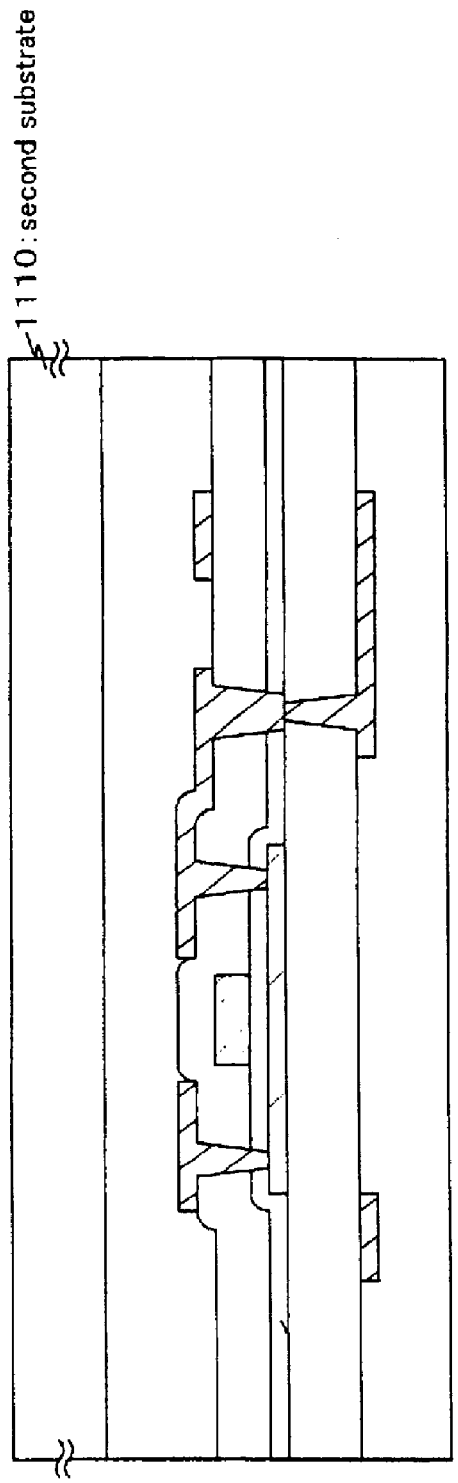
Fig. 5A
Fig. 5B

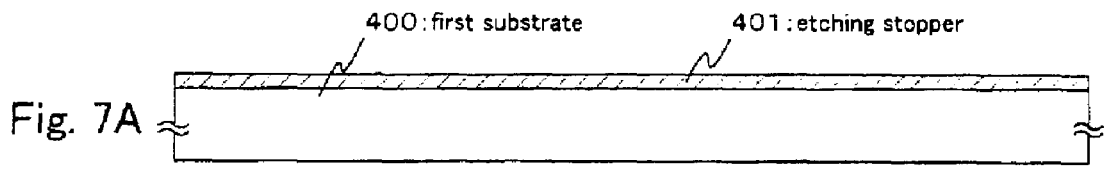
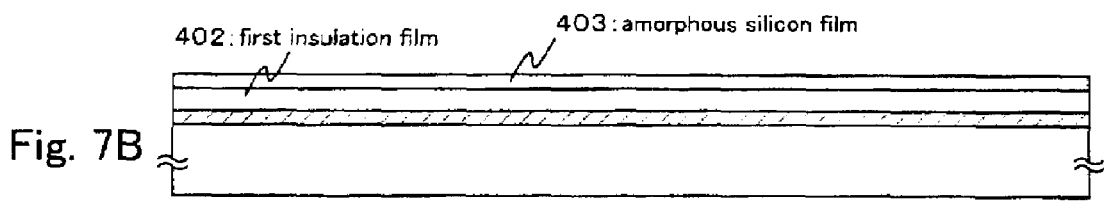
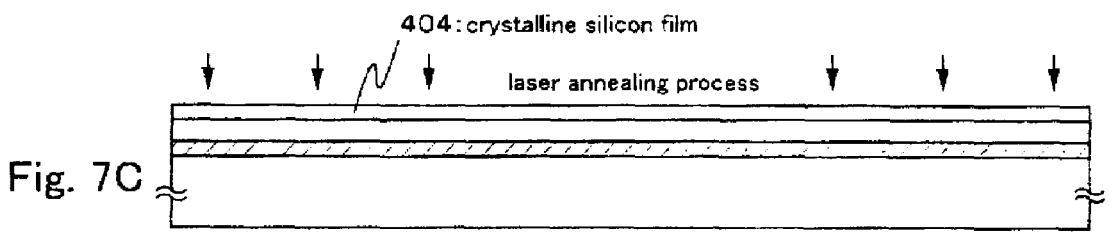
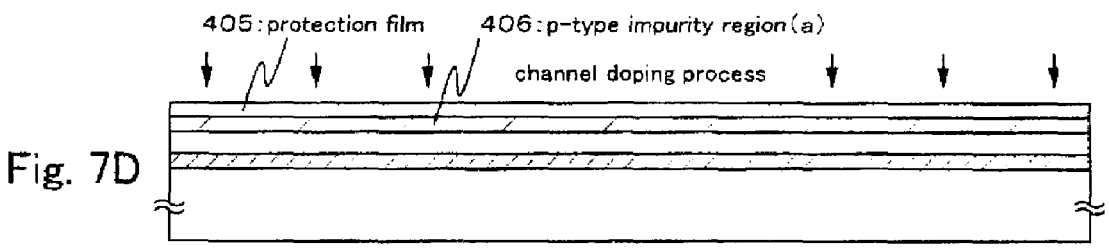
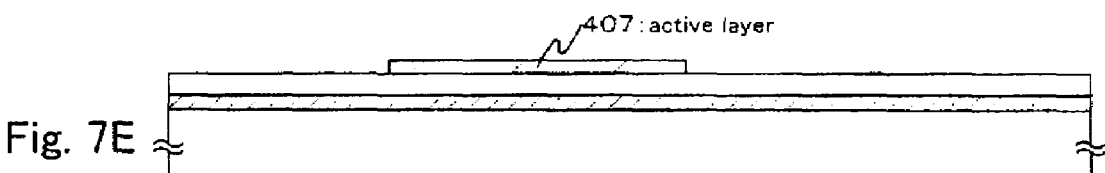
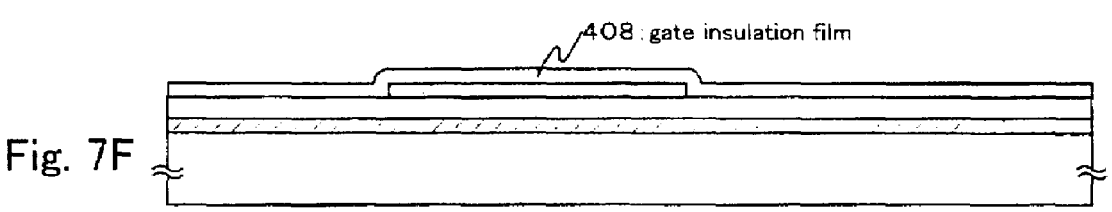

415: opening portion

416: source and drain wiring

417: passivation film  418: fourth insulation film

419: second substrate
420: adhesive
421: viscous adhesive
422: polarization film

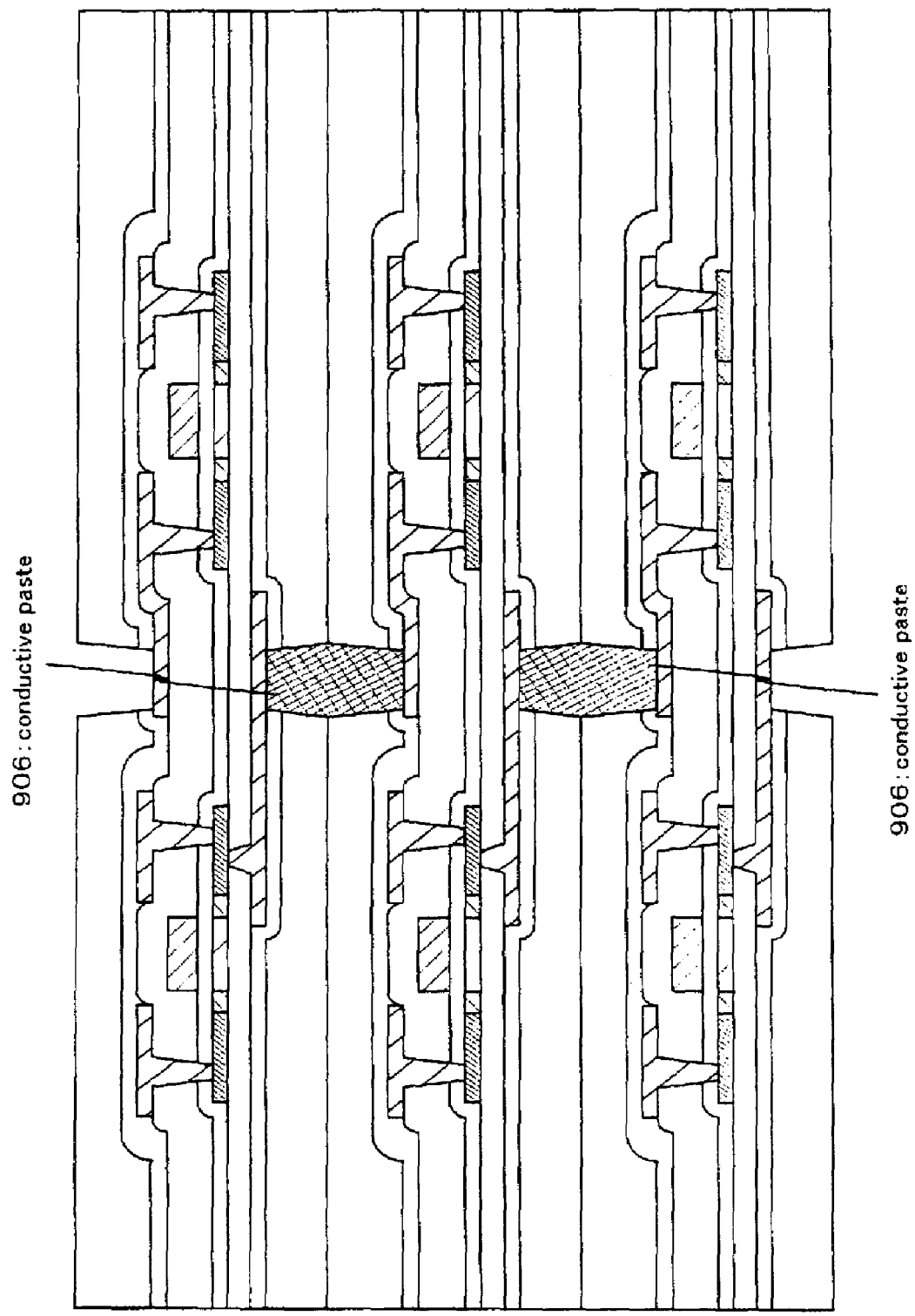

2420: second substrate
2401: first substrate

2421: opening portion

2422: second wiring
2423: insulation film

1200: pixel electrode

1202: fifth insulation film   1201: EL layer
1205: cover material   1204: filler material   1203: cathode

SEMICONDUCTOR DEVICE AND MANUFACTURING METHOD THEREOF

This application is a divisional application (and claims the benefit of priority under 35 U.S.C. § 120) of U.S. application Ser. No. 10/728,903, filed Dec. 8, 2003, now U.S. Pat. No. 7,109,071, and U.S. application Ser. No. 09/951,384, filed Sep. 14, 2001, now U.S. Pat. No. 6,682,963, which claims priority under 35 U.S.C. § 119 from Japanese Application Nos. 2000-280864 and 2000-280902 filed in Japan on Sep. 14, 2000. The contents of the prior applications are incorporated herein by reference in their entirety.

BACKGROUND OF THE INVENTION

1. Field of the Invention

The present invention relates to a method of manufacturing a semiconductor device, and in particular, it relates to a method of manufacturing a thin, flexible (having a flexible property) semiconductor device. Further, the present invention relates to a method of reducing parasitic capacitance which is generated between wirings formed on differing layers through insulating films. Note that the term semiconductor device in this specification indicates general devices which function by utilizing semiconductor properties, and that in particular, the present invention can be suitably applied to integrated circuits using elements having SOI (silicon on insulator) structures in which a semiconductor layer is formed on an insulator, to active matrix liquid crystal display devices structured using thin film transistors (TFTs), to active matrix EL display devices, and the like. The term thin film device indicates an electronic device containing a thin film transistor (TFT) structured using a semiconductor thin film, and at least one element from amount elements such as wirings, conductive layers, resistors, and capacitive elements in this specification.

2. Description of the Related Art

Integrated circuits using elements having SOI structures in which semiconductor layers are formed on an insulator exist as one kind of semiconductor device. It is possible to have little parasitic capacitance, and to have high operation speed, by forming semiconductor layers on insulators.

One type of semiconductor device is an active matrix liquid crystal display device. Structures in which a substrate on which thin film transistors (TFTs) are formed and used as switching elements of pixels (TFT formation substrate), and a substrate on which an opposing electrode is formed (opposing substrate) are joined, and liquid crystals are injected in a gap between the substrates, is prevalent for active matrix liquid crystal display devices. The voltage applied to the liquid crystals can be controlled for each single pixel by the TFTs formed on a transparent substrate such as glass, and therefore active matrix liquid crystal display devices have clear images and are widely used in office automation equipment, televisions, and the like.

Further, active matrix EL display devices are known as one type of semiconductor device. Active matrix EL display devices have a structure in which an EL material is sandwiched between two electrodes, and an electric current flows, thereby causing light to be emitted. The electric current flowing in the EL material can be controlled for each single pixel by using a plurality of pixel transistors, and therefore an image is clear.

The level of integration for these types of semiconductor devices is increased and becoming minute. Parasitic capacitance which is generated between wirings of a semiconductor device leads to electric signal propagation delays, and this hinders high speed operation and accurate electric signal propagation. There are two types of parasitic capacitance, one which is generated between wirings formed on the same layer, and one which is generated between wirings formed on different layers through an insulation film.

If the level of integration is increased, the distance between wirings formed on the same layer becomes smaller, thereby increasing the parasitic capacitance. Wirings may be moved to different layers in order to reduce the parasitic capacitance between wirings formed on the same layer. Namely, the integration level of wirings on the same layer is spread among several layers. Lowering the parasitic capacitance which is generated between wirings formed on different layers, through an insulation film, contributes to an improvement in the overall integration level of the semiconductor device.

There are methods such as making, insulation films thicker and increasing the distance between wirings, and using insulation films having a low dielectric constant, in order to reduce the parasitic capacitance generating between wirings formed on different layers through an insulation film. However, if the insulating film is made thicker, then not only does it become more difficult to form an opening portion in the insulation film in order to make a conductive connection between wirings, but there are also cases in which problems such as conductive layers formed by sputtering, for example, breaking in the inside of the opening portion, or being unable to ensure a sufficient film thickness, with the resistance therefore becoming large. Further, insulation films having lows dielectric constants have a likelihood to develop problems relating to film quality, such as resistance to heat and permeability, and manufacturing problems such as dimensional changes due to etching. For example, although dependent upon the etching conditions, the hole diameter may become larger to approximately 1 $\mu$m for a case in which a 1 $\mu$m thick acrylic is used, and there may be damage in improving the overall level of integration of the semiconductor device.

In addition, there is a method in which the formation order of the conductive layers used for forming the wirings is changed. For a case structuring integrated circuits, having two layers of wirings for making the conductive connection between elements, by top gate transistors, the following order of formation is normally used: active layer; first insulation film (gate insulation film); first conductive layer (gate electrode); second insulation film (first interlayer insulating film); second conductive layer (first wiring); third insulation film (second interlayer insulating film); and third conductive layer (second wiring).

If the structure is changed to the following: first conductive layer (second wiring); first insulation film (lower portion insulation film); active layer; second insulation film (gate insulation film); second conductive layer (gate electrode); third insulation film (first interlayer insulating film); and third conductive layer (first wiring); then the distance between the first wiring and the second wiring becomes large, and the parasitic capacitance generating between the wirings can be reduced.

The distance between the first wiring and the second wiring becomes large in this case, and problems relating to openings and the conductive connection can be prevented through the active layer, for example. However, even with the same second wiring, with the latter case a material able to withstand the film formation temperature of the subsequently formed active layer and the thermal activation temperature of injected impurities must be used, and the same materials cannot always be used by the former and latter cases. For example, Al is often used as a wiring material having a low resistivity, but its resistance to heat is low, and it cannot be used in the latter case.

Note that, within this specification, an electrode is a portion of a wiring, and the terms wiring and electrode are used separately for convenience. However, the term wiring is always contained within the word electrode.

Semiconductor devices like those stated above are recently being used in portable devices and the like, and there are demands to make the portable devices thinner, lighter, and more flexible (flexible property). The major portion of the thickness of a semiconductor device is the thickness of its substrate, and the substrate may be made thinner in order to make the portable device thinner and lighter. However, if the substrate is made thinner, then manufacturing becomes difficult due to trouble in photolithography processes caused by warping of the substrate during, manufacture, and substrate breakage more easily occurring during transportation of the substrate. A light, flexible display device can be manufactured, provided that a semiconductor device can be manufactured on a transparent plastic substrate or the like, but this has not yet been accomplished due to problems such as the heat resistance of plastic substrates.

Further, high speed operation of electric circuits and accurate propagation of electric signals can be performed for reducing the parasitic capacitance which is generated between wirings formed on different layers through an insulation film, thereby being able to use wiring materials having a low thermal resistance, such as Al, which have not been able to be used.

SUMMARY OF THE INVENTION

The inventors of the present invention considered a method of manufacturing a thin film device on a substrate possessing sufficient resistance to heat and strength during manufacturing, and then removing the substrate. First, a thin film device is formed on a first substrate, and then a second substrate is bonded. In this state, the thin film device exists between the first substrate and the second substrate. The first substrate is then removed, leaving the thin film device retained on the second substrate. An opening portion for reaching the thin film device retained on the second substrate is formed, and necessary processing such as forming a conductive layer so as to contact the thin film device through the opening portion, is performed, and the second substrate is also removed.

In addition, in the present invention, the first substrate and the second substrate are bonded by coating an adhesive in a portion of regions in which the thin film device is not formed. Alternatively, an adhesive is applied to a portion of the regions in which the thin film device is not formed, and other portions are temporarily restrained using a material such as viscous adhesive material. The second substrate can thus easily be removed by cutting the bonded portions.

The thin film device is always retained on one of the substrates if the above method of manufacture is used, but both substrates are peeled off in the end, so the first substrate and the second substrate may be thick, and substrates having sufficient strength can be used. In addition, little substrate warping and substrate breakage develops, resulting in that the manufacture is easy.

Flaws to the back surface of the substrate during substrate transportation in display devices such as active matrix liquid crystal display devices and active matrix EL display devices are a cause of a drop in display product quality, and this becomes a problem. The substrates used for support during manufacture are removed if the above method of manufacture is used, and therefore this problem is also resolved.

In addition, output electrodes can be formed in both the obverse and reverse sides of the thin film device if the above method of manufacture is used. If these are overlapped, then they can be applied to a three dimensional package and the like.

Further, there is also another invention in which a second wiring is formed in the side opposite to a first wiring with respect to an active layer, after forming: an active layer; a first insulation film (gate insulation film); a first conductive layer (gate electrode); a second insulation film (first interlayer insulating film); and a second conductive layer (first wiring), in order. Namely, a structure to be realized in which; a first conductive layer (second wiring); a first insulation film (lower portion insulation film); an active layer; a second insulation film (gate insulation film); a second conductive layer (gate electrode); a third insulation film (first interlayer insulating film); and a third conductive layer (first wiring) are formed. Note that, in this specification, the term active layer indicates a layer composed of a semiconductor film containing a channel region, a source region, and a drain region.

Parasitic capacitance generated between the first wiring and the second wiring can be reduced by the above structure, and the wirings are formed after forming the active layer. A material having a low resistance to heat can therefore be used.

Two substrates are used in the present invention in order to realize this type of structure. A thin film device is formed on the first substrate, and the second substrate is bonded to the surface on which the thin film device is formed. The first substrate is removed using a method such as mechanical grinding or chemical grinding, with the thin film device supported on the second substrate. The back surface of the thin film device is exposed when the first substrate is removed, and therefore wirings are formed. Wirings can therefore be formed on the top and bottom sides of the active layer. Cases in which transistors are formed on the first substrate, cases in which bottom gate transistors are formed, and cases in which top gate transistors are formed can be similarly structured. Note that the term bottom gate thin film transistor indicates a thin film transistor in which an active layer is formed in a layer between a gate electrode and a wiring, as shown in FIG. 27, in this specification.

Furthermore, by forming a top gate transistor on the first substrate, and then forming wirings only on the bottom side of the active layer, a transistor which becomes a bottom gate structure can be structured after removing the first substrate, provided that the manufacturing method of the present invention. In this case, parasitic capacitance between a first wiring formed on the bottom side of the active layer and a gate wiring can be reduced. In addition, impurities can be injected in a self-aligning manner using a gate electrode though it was not possible with a conventional bottom gate structure.

In accordance with one aspect of the present invention, the method for manufacturing a semiconductor device comprises the steps of:

forming a thin film device on a first substrate;
bonding a second substrate to the surface of the first substrate on which the thin film device is formed;
removing the first substrate, leaving the thin film device on the second substrate;
forming an opening portion for reaching the thin film device retained on the second substrate; and
cutting the second substrate so that the bonding portion of thin film device and the second substrate is removed, and removing the second substrate.

In accordance with another aspect of the present invention, the method for manufacturing a semiconductor device comprises the steps of:

forming a thin film device on a first substrate;

bonding a second substrate to the surface of the first substrate on which the thin film device is formed;

removing the first substrate, leaving the thin film device on the second substrate;

forming an opening portion for reaching the thin film device retained on the second substrate, and forming at lest one conductive layer contacting the thin film device through the opening portion; and cutting the second substrate so that the bonding portion of the thin film device and the second substrate is removed, and removing the second substrate.

In accordance with another aspect of the present invention, the method for manufacturing a semiconductor device comprises the steps of:

forming a thin film device on a first substrate;

coating regions in which the thin film device is formed, and regions in which the thin film device is not formed, separately by using at least two types of adhesives, and bonding a second substrate to the surface of the first substrate on which the thin film device is formed;

removing the first substrate, leaving the thin film device on the second substrate;

forming an opening portion for reaching the thin film device retained on the second substrate; and cutting the second substrate so that the regions coated with adhesive are removed.

In accordance with another aspect of the present invention, the method for manufacturing a semiconductor device comprises the steps of:

coating regions in which the thin film device is formed, and regions in which the thin film device is not formed, separately by using at least two types of adhesives, and bonding a second substrate to the thin film device formed on the first substrate;

removing the first substrate, leaving the thin film device on the second substrate;

forming an opening portion for reaching the thin film device retained on the second substrate, and forming at least one conductive layer contacting the thin film device through the opening portion; and cutting the second substrate so that the regions coated with adhesive are removed.

In accordance with another aspect of the present invention, the method for manufacturing a semiconductor device comprises the steps of:

forming a first thin film device on one surface of a first substrate;

partially bonding a thin film or a second thin film device to a second substrate;

bonding the thin film or the second thin film device bonded to the second substrate to the first thin film device formed on the first substrate;

removing the first substrate, leaning the first thin film device on the second substrate;

forming an opening portion in the first thin film device retained on the second substrate; and cutting the second substrate so that the bonding portion of the thin film, or the second thin film device, and the second substrate is removed, and removing only the second substrate, leaving the thin film or the second thin film device.

In accordance with another aspect of the present invention, the method for manufacturing a semiconductor device comprises the steps of:

forming a first thin film device on one surface of a first substrate;

partially bonding a thin film or a second thin film device to a second substrate;

bonding the thin film or the second thin film device bonded to the second substrate to the first thin film device formed on the first substrate;

removing the first substrate, leaving the thin film device on the second substrate;

forming at least one conductive layer on the first thin film device retained on the second substrate; and cutting the second substrate so that the bonding portion of the thin film, or the second thin film device, and the second substrate is removed, and removing only the second substrate, leaving the thin film or the second thin film device.

In accordance with another aspect of the present invention, the method for manufacturing a semiconductor device comprises the steps of:

forming a first thin film device on one surface of a first substrate;

coating locations in which the thin film device exists, and locations in which the thin film device does not exist, separately by using at least two types of adhesives, and bonding a thin film or a second thin film device to a second substrate;

bonding the thin film or the second thin film device bonded to the second substrate to the first thin film device formed on the first substrate;

removing the first substrate, leaving the thin film device on the second substrate;

forming an opening portion in the first thin film device retained on the second substrate; and cutting the second substrate so that a portion of the thin film, or the second thin film device, and the second substrate is removed. Land removing only the second substrate, leaving the thin film or the second thin film device.

In accordance with another aspect of the present invention, the method for manufacturing a semiconductor device comprises the steps of:

forming a first thin film device on one surface of a first substrate;

coating locations in which the thin film device exists, and locations in which the thin film device does not exist, separately by using at least two types of adhesives, and bonding a thin film or a second thin film device to a second substrate;

bonding the thin film or the second thin film device bonded to the second substrate to the first thin film device formed on the first substrate;

removing the first substrate, leaving the first thin film device on the second substrate;

forming at least one conductive layer in the first thin film device retained on the second substrate; and cutting the second substrate so that a portion of the thin film, or the second thin film device, and the second substrate is removed, and removing only the second substrate, leaving the thin film or the second thin film device.

In accordance with another aspect of the present invention, the method for manufacturing a semiconductor device comprises the steps of:

forming a first thin film device on one surface of a first substrate;

partially bonding a thin film or a second thin film device to a second substrate;

bonding the thin film or the second thin film device bonded to the second substrate to the first thin film device formed on the first substrate; and cutting the second substrate so that the bonding portion of the thin film, or the second thin film device, and the second substrate is removed, and removing only the second substrate, leaving the thin film or the second thin film device.

In accordance with another aspect of the present invention, the method for manufacturing a semiconductor device comprises the steps of:

forming a first thin film device on one surface of a first substrate;

coating locations in which the thin film device exists, and locations in which the thin film device does not exist, separately by using at least two types of adhesives, and bonding a thin film or a second thin film device to a second substrate;

bonding the thin film or the second thin film device bonded to the second substrate to the first thin film device formed on the first substrate; and cutting the second substrate so that a portion of the thin film, or the second thin film device, and the second substrate is removed, and removing only the second substrate, leaving the thin film or the second thin film device.

In accordance with another aspect of the present invention, the method for manufacturing a semiconductor device comprises the steps of:

forming a first thin film device on one surface of a first substrate;

partially bonding a thin film or a second thin film device to a second substrate;

introducing liquid crystals between the first thin film device formed on the first substrate and the thin film, or the second thin film device, bonded to the second substrate; and cutting the first substrate, the first thin film device, the second substrate, and the thin film or the second thin film device, so that a portion of the first substrate, the first thin film device, the second substrate, and the thin film or the second thin film device is removed, and removing the second substrate, leaving the thin film or the second thin film device.

In accordance with another aspect of the present invention, the method for manufacturing a semiconductor device comprises the steps of:

forming a first thin film device on one surface of a first substrate;

coating locations in which the thin film device exists, and locations in which the thin film device does not exist, separately by using at least two types of adhesives, and bonding a thin film or a second thin film device to a second substrate;

introducing a liquid crystal between the first thin film device formed on the first substrate and the thin film, or the second thin film device, bonded to the second substrate; and cutting the first substrate, the first thin film device, the second substrate, and the thin film or the second thin film device, so that a portion of the first substrate, the first thin film device, the second substrate, and the thin film or the second thin film device is removed, and removing the second substrate, leaving the thin film or the second thin film device.

In accordance with another aspect of the present invention, the method for manufacturing a semiconductor device comprises the steps of:

forming a thin film device on one face of a first substrate;

partially bonding a polarization film or a polarization plate to a second substrate;

bonding the polarization film or the polarization plate bonded to the second substrate to the thin film device formed on the first substrate;

removing the first substrate, leaving the thin film device on the second substrate;

forming an opening portion in the thin film device retained on the second substrate; and cutting the second substrate so that the bonding portion of the polarization film, or the polarization plate, and the second substrate is removed, and removing only the second substrate, leaving the polarization film or the polarization plate.

In accordance with another aspect of the present invention, the method for manufacturing a semiconductor device comprises the steps of:

forming a thin film device on one face of a first substrate;

partially bonding a polarization film or a polarization plate to a second substrate;

bonding the polarization film or the polarization plate bonded to the second substrate to the thin film device formed on the first substrate;

removing the first substrate, leaving the thin film device on the second substrate;

forming at least one conductive layer on the thin film device retained on the second substrate; and cutting the second substrate so that the bonding portion of the polarization film, or the polarization plate, and the second substrate is removed, and removing only the second substrate, leaving the polarization film or the polarization plate.

In accordance with another aspect of the present invention, the method for manufacturing a semiconductor device comprises the steps of:

forming a thin film device on one face of a first substrate;

coating locations in which the thin film device exists, and locations in which the thin film device does not exist, separately by using at least two types of adhesives, and bonding a polarization film or a polarization plate to a second substrate;

bonding the polarization film or the polarization plate bonded to the second substrate to the thin film device formed on the first substrate;

removing the first substrate, leaving the thin film device on the second substrate;

forming an opening portion in the thin film device retained on the second substrate; and cutting the second substrate so that a portion of the polarization film, or the polarization plate, and the second substrate is removed, and removing only the second substrate, leaving the polarization film or the polarization plate.

In accordance with another aspect of the present invention, the method for manufacturing a semiconductor device comprises the steps of:

forming a thin film device on one face of a first substrate;

coating locations in which the thin film den ice exists, and locations in which the thin film device does not exist, separately by using at least two types of adhesives, and bonding a polarization film or a polarization plate to a second substrate;

bonding the polarization film or the polarization plate bonded to the second substrate to the thin film device formed on the first substrate;

removing the first substrate, leaving the thin film device on the second substrate;

forming at least one conductive layer on the thin film device retained on the second substrate; and cutting the second substrate so that a portion of the polarization film, or the polarization plate, and the second substrate is removed, and removing only the second substrate, leaving the polarization film or the polarization plate.

In accordance with another aspect of the present invention, the method for manufacturing a semiconductor device comprises the steps of:

forming a thin film device on one surface of a first substrate;

forming an electrode on the thin film device;

partially bonding a second substrate to the thin film device formed on the first substrate, and;

removing the first substrate, leaving the thin film device oil the second substrate;

forming an opening portion in the thin film device retained on the second substrate;

cutting the second substrate so that the bonding portion of the thin film device and the second substrate is removed, and removing the second substrate; and forming and overlapping a plurality of thin film devices from the thin film device obtained in accordance with the preceding steps, and making the electrodes formed on the top and an electrode formed on the bottom of the thin film devices conductive.

In accordance with another aspect of the present invention, the method for manufacturing a semiconductor device comprises the steps of:

forming a thin film device on one surface of a first substrate;

forming an electrode on the thin film device;

partially bonding a second substrate to the thin film device formed on the first substrate;

removing the first substrate, leaving the thin film device on the second substrate;

forming an opening portion in the thin film device retained on the second substrate, and forming at least one conductive layer to form an electrode;

cutting the second substrate so that the bonding portion of the thin film device and the second substrate is removed, and removing the second substrate; and forming and overlapping a plurality of thin film devices from the thin film device obtained in accordance with the preceding steps, and making the electrodes formed on the top and bottom of the thin film devices conductive.

In accordance with another aspect of the present invention, the method for manufacturing a semiconductor device comprises the steps of:

forming a thin film device on one surface of a first substrate;

forming an electrode on the thin film device;

coating locations in which the thin film device exists, and locations in which the thin film device does not exist, separately by using at least two types of adhesives, and bonding a second substrate to the thin film device formed on the first substrate;

removing the first substrate, leaving the thin film device on the second substrate;

forming an opening portion in the thin film device retained on the second substrate;

cutting the second substrate so that a portion of the thin film device and the second substrate is removed, and removing the second substrate; and forming and overlapping a plurality of thin film devices from the thin film device obtained in accordance with the preceding steps, and making the electrodes formed on the top and an electrode formed on the bottom of the thin film devices conductive.

In accordance with another aspect of the present invention, the method for manufacturing a semiconductor device comprises the steps of:

forming a thin film device on one surface of a first substrate;

forming an electrode on the thin film device;

coating locations in which the thin film device exists, and locations in which the thin film device does not exist, separately by using at least two types of adhesives, and bonding a second substrate to the thin film device formed on the first substrate;

removing the first substrate, leaving the thin film device on the second substrate;

forming an opening portion in the thin film device retained on the second substrate, and forming at least one conductive layer, forming an electrode;

cutting the second substrate so that the bonding portion of the thin film device and the second substrate is removed, and removing the second substrate; and forming and overlapping a plurality of thin film devices from the thin film device obtained in accordance with the preceding steps, and making the electrodes formed on the top and bottom of the thin film devices conductive.

In accordance with another aspect of the present invention, the method for manufacturing a semiconductor device comprises the steps of:

forming a first thin film device on one surface of a first substrate;

forming an electrode on the first thin film device;

partially bonding a thin film or a second thin film device having an opening portion to a second substrate; or forming an opening portion in the thin film or the second thin film device after partially bonding the thin film or the second thin film device to the second substrate;

bonding the thin film or the second thin film device bonded to the second substrate to the first thin film device formed on the first substrate;

removing the first substrate, leaving the first thin film device on the second substrate;

forming an opening portion in the first thin film device retained on the second substrate;

cutting the second substrate so that the bonding portion of the thin film, or the second thin film device, and the second substrate is removed, and removing only the second substrate, leaving the thin film or the second thin film device; and forming and overlapping a plurality of thin film devices from the thin film device obtained in accordance with the preceding steps, and making the electrodes formed on the top and bottom of the thin film devices conductive.

In accordance with another aspect of the present invention, the method for manufacturing a semiconductor device comprises the steps of:

forming a first thin film device on one surface of a first substrate;

forming an electrode on the first thin film device;
partially bonding a thin film, or a second thin film device, having an opening portion, to a second substrate; or forming an opening portion in the thin film or the second thin film device after partially bonding, the thin film or the second thin film device to the second substrate;
bonding the thin film or the second thin film device bonded to the second substrate to the first thin film device formed on the first substrate;
removing the first substrate, leaving the first thin film device on the second substrate;
forming an opening portion in the first thin film device retained on the second substrate, and forming at least one conductive layer to form an electrode;
cutting the second substrate so that the bonding portion of the thin film, or the second thin film device, and the second substrate is removed, and removing only the second substrate, leaving the thin film or the second thin film device; and
forming and overlapping a plurality of thin film devices from the thin film device obtained in accordance with the preceding steps, and making the electrodes formed on the top and bottom of the thin film devices conductive.

In accordance with another aspect of the present invention, the method for manufacturing a semiconductor device comprises the steps of:
forming a first thin film device on one surface of a first substrate;
forming an electrode on the first thin film device;
coating locations in which the thin film device exists, and locations in which the thin film device does not exist, separately by using at least two types of adhesives, and bonding a thin film, or a second thin film device, having an opening portion, to a second substrate; or coating locations in which the thin film device exists, and locations in which the thin film device does not exist, separately by using at least tango types of adhesives to form an opening portion in the thin film or the second thin film device after bonding the thin film or the second thin film device to the second substrate;
bonding the thin film or the second thin film device bonded to the second substrate to the first thin film device formed on the first substrate;
removing the first substrate, leaving the first thin film device on the second substrate;
forming an opening portion in the first thin film device retained on the second substrate;
cutting the second substrate so that a portion of the thin film, or the second thin film device, and the second substrate is removed, and removing only the second substrate, leaving the thin film or the second thin film device; and
forming and overlapping a plurality of thin film devices from the thin film device obtained in accordance with the preceding steps, and making the electrodes formed on the top and bottom of the thin film devices conductive.

In accordance with another aspect of the present invention, the method for manufacturing a semiconductor device comprises the steps of:
forming a first thin film device on one surface of a first substrate;
forming an electrode on the first thin film device;
coating locations in which the thin film device exists, and locations in which the thin film device does not exist, separately by using at least two types of adhesives, and bonding a thin film, or a second thin film device, having an opening portion, to a second substrate; or coating locations in which the thin film device exists, and locations in which the thin film device does not exist, separately by using at least two types of adhesives to form an opening portion in the thin film or the second thin film device after bonding the thin film or the second thin film device to the second substrate;
bonding the thin film or the second thin film device bonded to the second substrate to the first thin film device formed on the first substrate;
removing the first substrate, leaving the first thin film device oil the second substrate;
forming an opening portion in the first thin film device retained on the second substrate, and forming at least one conductive layer to form an electrode;
cutting the second substrate so that a portion of the thin film, or the second thin film device, and the second substrate is removed, and removing only the second substrate, leaving the thin film or the second thin film device; and
forming and overlapping a plurality of thin film devices from the thin film device obtained in accordance with the preceding steps, and making the electrodes formed on the top and bottom of the thin film devices conductive.

In accordance with another aspect of the present invention, the method for manufacturing a semiconductor device comprises the steps of:
forming a thin film device on a first substrate;
bonding the surface of the first substrate on which the thin film device is formed to a second substrate;
removing the first substrate; and
forming an opening portion in the thin film device retained on the second substrate.

In accordance with another aspect of the present invention, the method for manufacturing a semiconductor device comprises the steps of:
forming a thin film device on a first substrate;
bonding the surface of the first substrate on which the thin film device is formed to a second substrate;
removing the first substrate; and
forming at least one conductive layer in the thin film device retained on the second substrate.

In accordance with another aspect of the present invention, the semiconductor device comprises a semiconductor formed on an insulator as an active layer, wherein: at least one conductive layer is formed above, and below, the active layer using a material capable of withstanding a temperature of 550° C.

In accordance with another aspect of the present invention, the thin film transistor comprises a semiconductor formed on an insulator as an active layer, comprising:
a gate insulating film on the active layer;
a gate electrode on the gate insulating film;
performing impurity addition using the gate electrode as a mask; and
a wiring on the side opposite the gate electrode, with respect to the active layer, using a material having a resistance to heal equal to or less than 550° C.

In accordance with another aspect of the present invention, the semiconductor device comprises a semiconductor formed on an insulator as an active layer, comprising:
a pair of polarization films;
a pixel electrode;
a thin film transistor composed of: an active layer; a gate insulating film contacting the active layer; and a gate electrode contacting the gate insulating film;
a wiring connected to the active layer from the gate electrode side;

an opposing electrode;
liquid crystals between a pixel electrode formed between the pair of polarization films, and the opposing electrode;
a sealant; and
an orientation film.

In accordance with another aspect of the present invention, the semiconductor device comprises a semiconductor formed on an insulator as an active layer comprising:
a pair of polarization films;
a thin film transistor composed of: an active layer contacting a first insulating film; a gate insulating film contacting the active layer; and a gate electrode contacting the gate insulating film;
a third insulating film contacting the gate electrode;
a passivation film contacting the third insulating film;
a wiring electrically connected to each thin film transistor through an opening portion formed in the third insulating film and in the gate insulating film;
a pixel electrode formed in the surface opposite that in which the gate electrode of the active layer is formed;
an orientation film formed contacting the pixel electrode;
an opposing electrode formed in one polarization film of the pair of polarizing films;
liquid crystals between the pixel electrode, formed between the pair of polarizing films, and the opposing electrode; and
a sealant formed between the first insulating film and the pair of polarizing films.

BRIEF DESCRIPTION OF THE DRAWINGS

In the accompanying drawings:

FIGS. 5A and 5B are diagrams showing an embodiment mode of the present invention;

FIGS. 7A to 7F are diagrams showing an example of an embodiment of the present invention;

FIG. 16 is a diagram showing an example of an embodiment of the present invention;

DETAILED DESCRIPTION OF THE PREFERRED EMBODIMENTS

Embodiment Mode 1

Figure 1A:
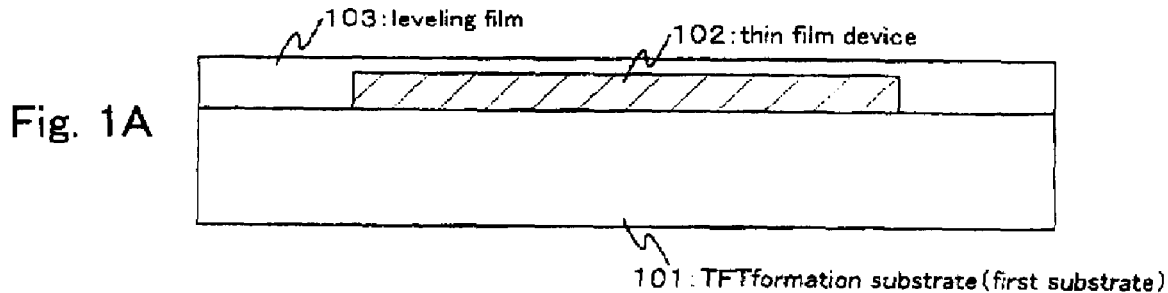
FIGS. 1A to 1D are diagrams showing an embodiment mode of the present invention.
Figure 1B:
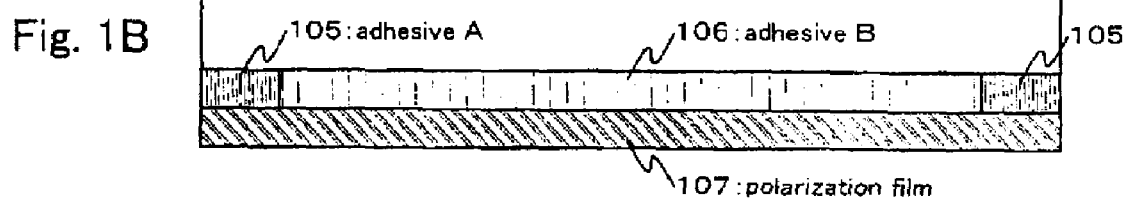

A method of manufacturing an active matrix liquid crystal display device using the present invention is explained using FIG. 1A to FIG. 3C.

First, a thin film device (which becomes a thin film device 103) is manufactured on a TFT formation substrate 101 as a first substrate. A leveling film 103 may be added, leveling a surface for bonding a second substrate. (See FIG. 1A.)

A supporting material 104 is prepared as a second substrate, and a polarization film 107 is attached by an adhesive. Note that an example of bonding in which two types of adhesives are used separately is shown here. An adhesive A 105 bonds the outside of the thin film device 102 when joining the first substrate and the second substrate, as stated the below, and an adhesive B 106 is a viscous adhesive and temporarily restrains the polarization film during a period up until the supporting material 104 is removed. (See FIG. 1B.)

A polarization film may also be joined to the leveling film 103 over the TFT formation substrate 101, of course, and be bonded to the supporting material 104 bonded.

Figure 1C:
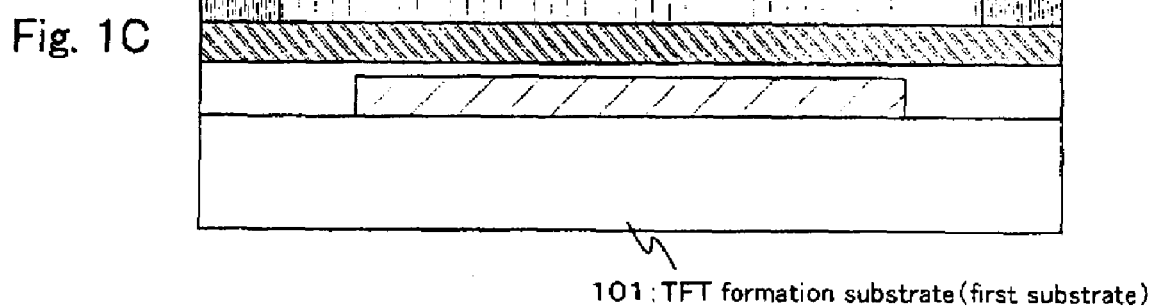
Figure 1D:
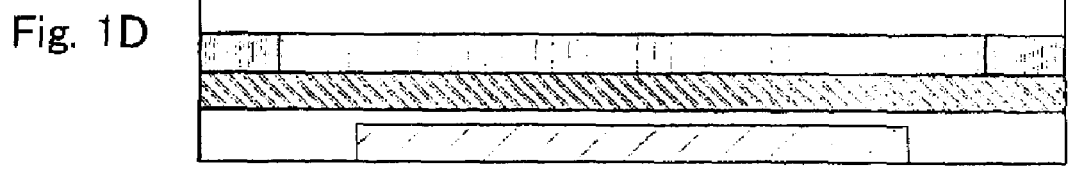
Figure 2A:
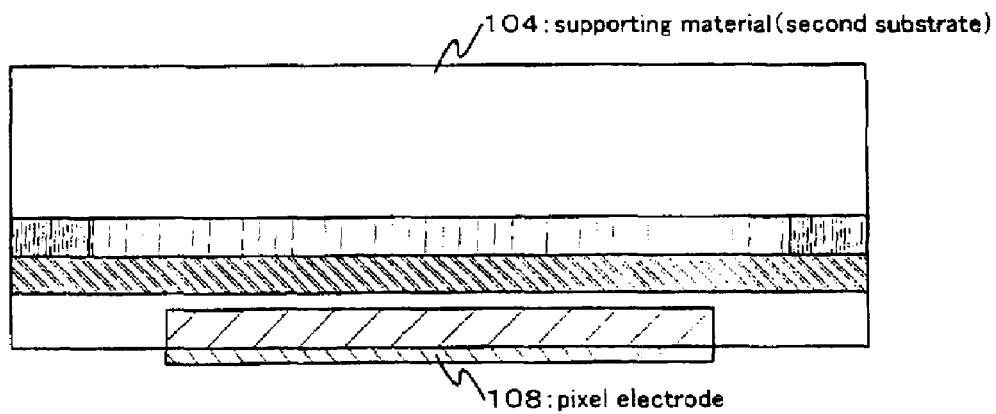
FIGS. 2A and 2B are diagrams showing an embodiment mode of the present invention.
Figure 2B:
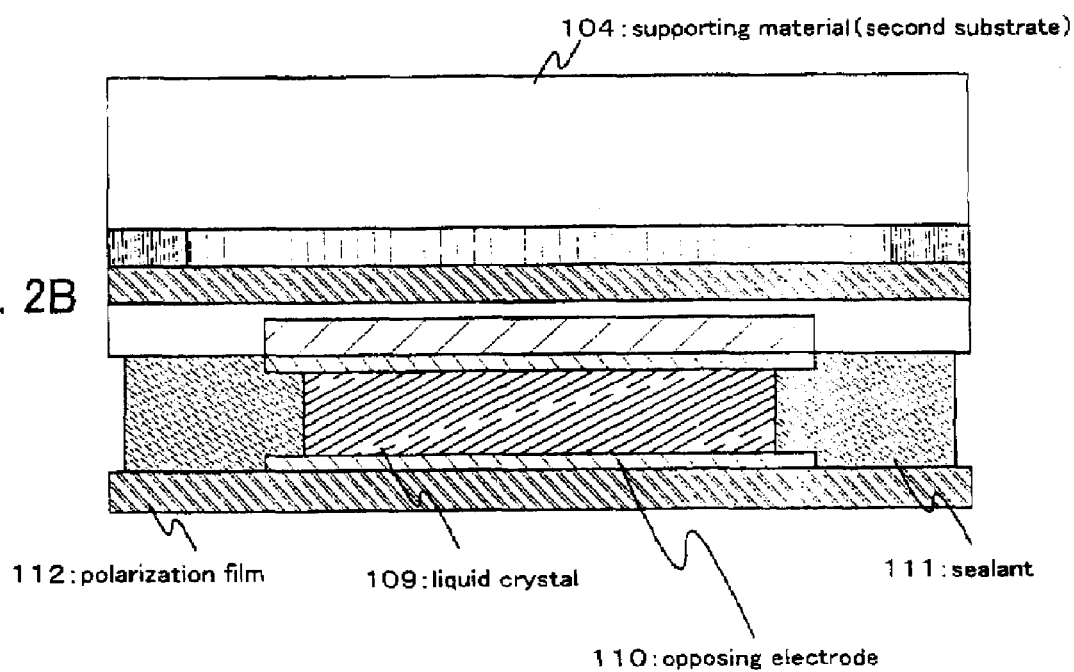

In FIG. 1C, an adhesive is coated on the fringe of the leveling film 103 formed over the TFT formation substrate 101 through the thin film device 102, and on the fringe of the surface of the supporting material 104 on which the polarization film 107 is attached, and both substrates are bonded. The first substrate is then removed by a method such as back grinding or CMP, thereby exposing the surface of the thin film device 102. (See FIG. 1D.) In practice, a film such as a nitride film may also be prepared as a stopper in the lowest layer of the thin film device 102, and wet etching performed at the end of grinding.

A pixel electrode 108 is formed next in the thin film device 102 retained on the supporting material 104. (See FIG. 2A.) An opposing electrode 110 is attached to the polarization film 112, and liquid crystals 109 are enclosed using a sealant 111. (See FIG. 2B.) Note that one more supporting material may be prepared to support the polarization film 112 in case the polarization film flexes.

Figure 3A:
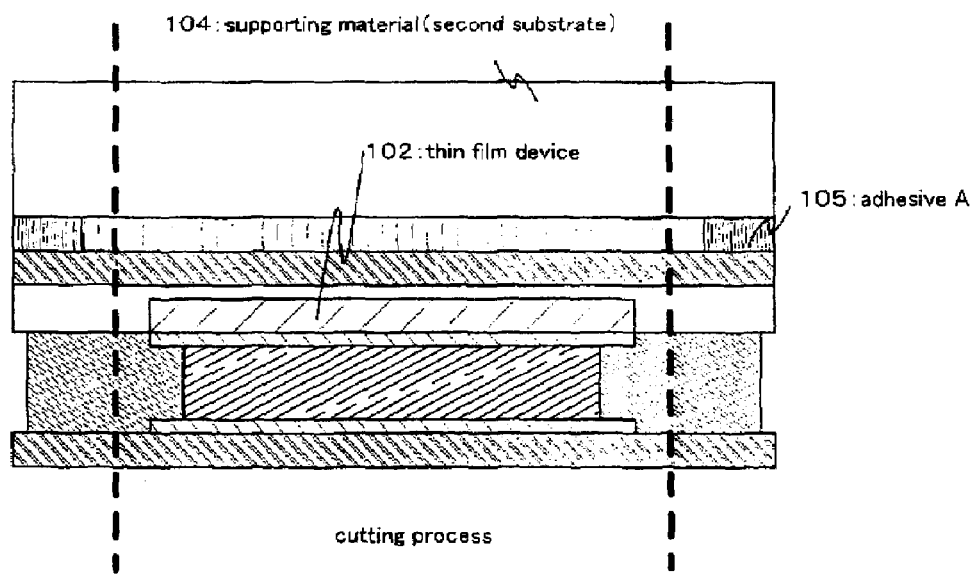
FIGS. 3A to 3C are diagrams showing an embodiment mode of the present invention.
Figure 3B:
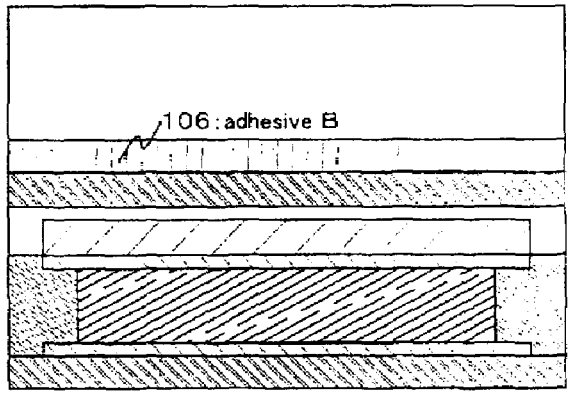
Figure 3C:
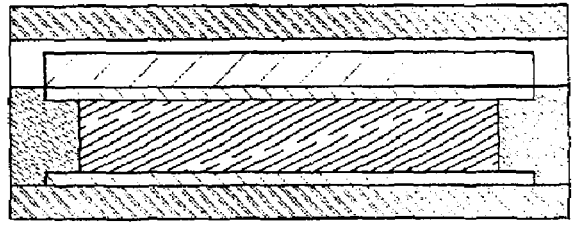

In FIG. 3A, the substrate is cut at locations for detaching the adhesive A 105 in the outside of the thin film device 102.

Regions coated by the adhesive A 105 are removed by cutting, thereby only leaving regions coated by the viscous adhesive as the adhesive B 106 (see FIG. 3B), and the supporting material 104 is removed. (See FIG. 3C.)

A semiconductor device can thus be given flexibility (flexible property), made thinner, and made lighter weight by manufacturing in a state in which it is fixed to a substrate, and by lastly removing the substrate. Note that an example relating to an active matrix liquid crystal display device is shown here, and therefore the polarization film is joined to the surface after removal from the substrate. Depending upon the usage objective, a film for surface protection, a film as a supporting material, and the like can freely combined and used.

Embodiment Mode 2

A manufacturing method of the present invention is explained simply regarding a semiconductor device using a thin film transistor (TFT). The explanation here is made by utilizing a cross sectional diagram of one thin film transistor and wirings, but it can also be applied to an integrated circuit using a plurality of transistors, of course.

Figure 4A:
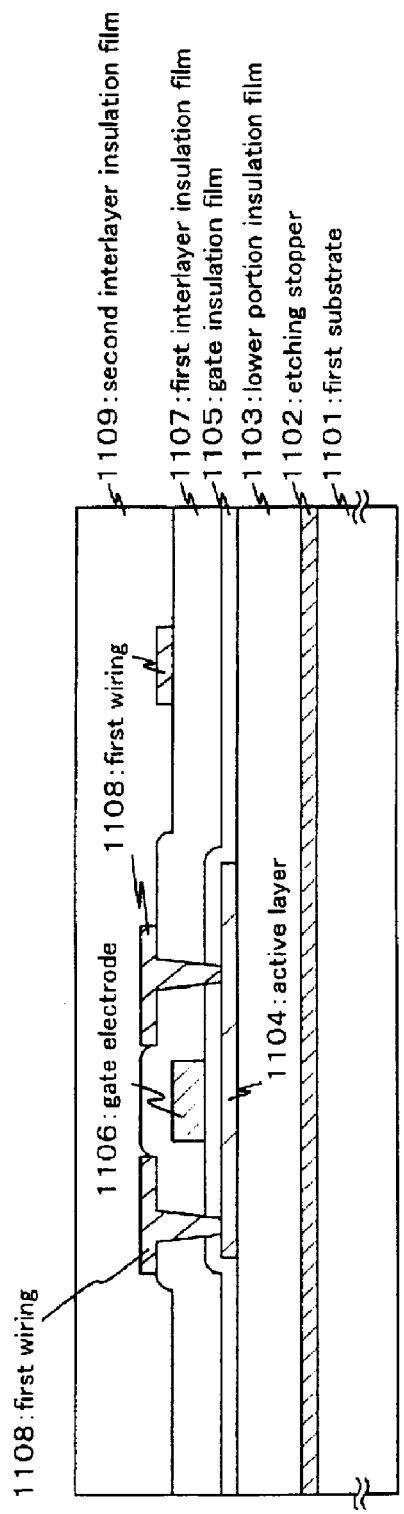
FIGS. 4A and 4B are diagrams showing an embodiment mode of the present invention.

An etching stopper 1102, which will be later utilized when removing a first substrate 1101, is formed on the first substrate 1101. A transistor is structured by a lower portion insulation film 1103, an active layer 1104 composed of a semiconductor such as silicon, a gate insulation film 1105, and a gate electrode 1106 formed on the etching stopper 1102. A first interlayer insulating film 1107 is formed, in opening portion for reaching the active layer 1104 is formed, and a first wiring 1108 is formed through the opening portion. A second interlayer insulation film 1109 is formed (See FIG. 4A.)

Figure 4B:
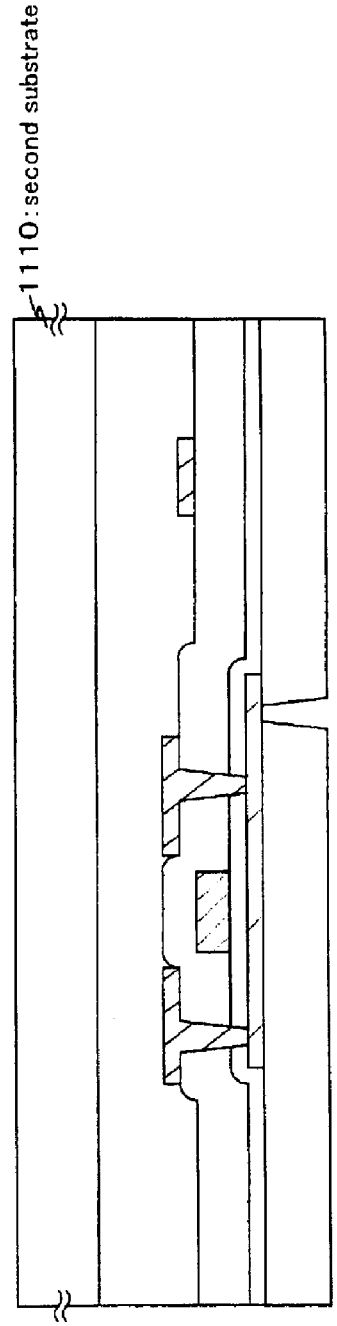

A second substrate 1110 is bonded to the surface of the side of the first substrate 1101 over which a thin film device is formed, the first substrate 1101 and the etching stopper 1102 are removed, and an opening portion for reaching the active layer 1104 is formed. (See FIG. 4B.) It is not always necessary to form the etching stopper 1102, but a film such as a nitride film may be prepared in the lowest layer of the transistor and used as a stopper by performing wet etching last.

A second wiring 1111 contacting the active layer through the opening portion is formed, and an insulation film 1112 is formed. (See FIG. 5A.) The conductive connection is formed between the first wiring 1108 and the second wiring 1111 through the active layer in this case, but a larger opening portion may also be formed in only a portion for alignment precision, and the two wirings may be connected directly. Whichever method is used, opening portions are formed from the top and the bottom with the structure of the present invention, and therefore it is easy to form the conductive connection. Further, wirings are formed after forming the active layer, and therefore wirings having low heat resistance can be used.

Figure 6:
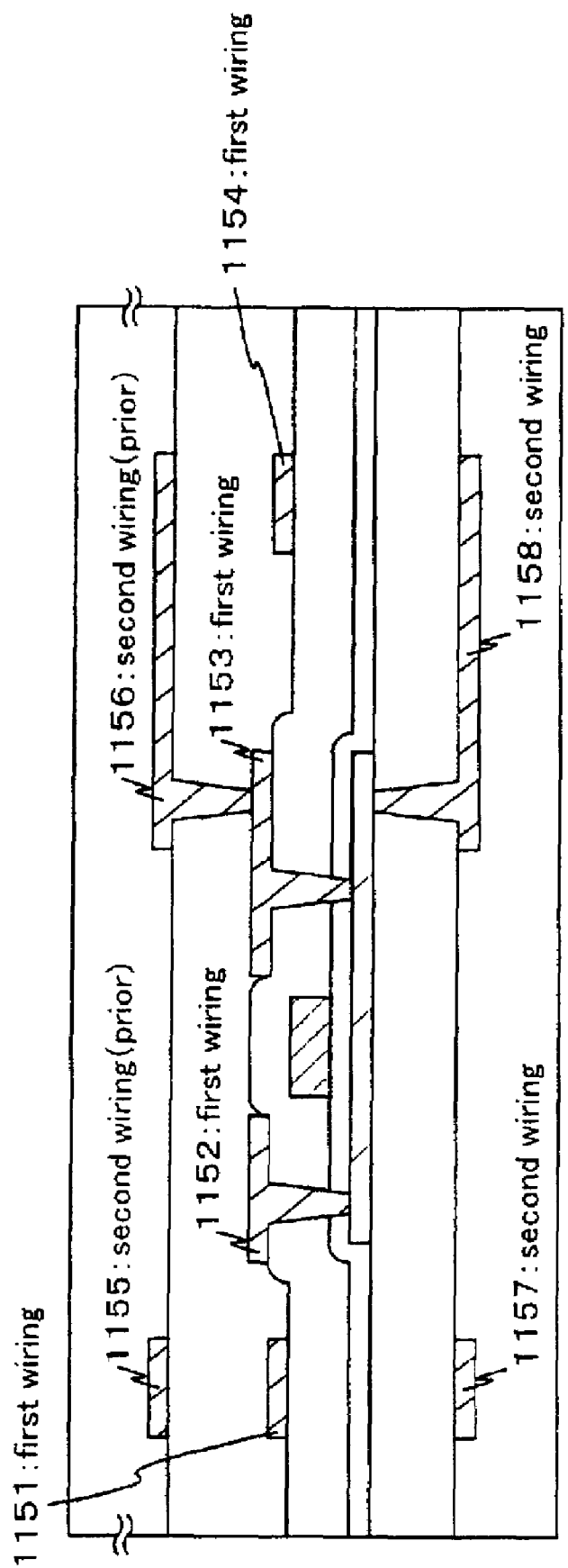
FIG. 6 is a diagram showing an embodiment mode of the present invention.

An active layer, a gate insulating film, a gate electrode, a first interlayer insulating film, a first wiring, a second interlayer insulating film, a second wiring, and the second wiring for a conventional structure are shown at the same time in FIG. 6 for comparison. Note that first wirings 1151 and 1154, and second wirings 1155 and 115 are cross sections of wirings which are not electrically connected to the thin film transistor shown in the figures here.

If the structure of the present invention is not used, a second wiring 1158 is in a location denoted by reference numeral 1156, the second wiring 1156 is close to the first wiring 1154, and their parasitic capacitance also becomes large. Further, the second wiring 1157 may be formed in the location denoted by reference numeral 1155, or may be formed in the location denoted by reference numeral 1115 as a first wiring. In this case, the distance to a first wiring 1152 becomes short.

In other words, the distance between the first wirings and the second wirings is the thickness of the second interlayer insulating film with the conventional structure, and it becomes the combined thickness of the lower portion insulation film and the first interlayer insulating film with the manufacturing method of the present invention. The combined thickness of the lower portion insulation film and the first interlayer insulating film of course is larger than the thickness of the second interlayer insulating film.

The effective thickness of the insulation films between the wirings can thus be increased, and the parasitic capacitance which is generated between wirings formed in different layers can be reduced, by using the manufacturing method of the present invention. Note that, although there are problems in the conductive connection through the insulation films by simply making the insulation films thicker, as done conventionally, there are no such problems with the method of manufacture of the present invention. Further, the structure in which wirings are formed in portions belong the active layer are the same as with conventional structures, but the wirings are formed after forming the active layer, and therefore wiring materials having low heat resistance can be used. Low resistance wirings which could not be used due to their lows thermal resistance can therefore be used.

EMBODIMENTS

Embodiment 1

An example of applying a method of manufacturing a semiconductor device of the present invention to an active matrix liquid crystal display device is shown here. Note that only one pixel portion of a liquid crystal display device is shown in the figures because locations at which adhesives are used separately, sealant locations, locations for cutting substrates, and the like are explained. The present invention can be applied, of course, to devices such as a liquid crystal display device having a plurality of pixels, and to a liquid crystal display device formed integrated with a driver circuit.

A glass substrate or a quartz substrate can be used as a first substrate 400 in FIG. 7A. In addition, substrates having an insulation film formed on their surfaces, such as a silicon substrate, a metallic substrate, or a stainless steel substrate, can also be used.

An etching stopper 401 is formed next for removal of the first substrate 400. A material having a selectivity which is sufficiently large with respect to the first substrate is used for the etching stopper 401. A quartz substrate is used as the first substrate 400, and a silicon nitride film having a thickness of 10 to 1000 nm (typically between 100 and 500 nm) is formed on the etching stopper 401 in this embodiment.

A first insulation film 402 is formed on the etching stopper 401 from a 10 to 1000 nm thick (typically 300 to 500 nm thick) silicon oxide film. Further, a silicon oxynitride film may also be used.

Subsequently, a 10 to 100 nm thick amorphous semiconductor film (an amorphous silicon film 403 in this embodiment) is formed by a known film formation method on the first insulation film 402. Note that, in addition to the amorphous silicon film, an amorphous compound semiconductor film such as amorphous silicon germanium film can also be used as the amorphous semiconductor film.

A semiconductor film containing a crystalline structure (a crystalline silicon film 404 in this embodiment) is then formed in accordance with the technique recorded in Japanese Patent Application Laid-open No. 7-130652 (U.S. Pat. No. 5,643,826). The technique recorded in the above patent is a means of crystallization using a catalyst element (one element, or a plurality of elements, selected from the group consisting of nickel, cobalt, germanium, tin, lead, palladium, iron, and copper, typically nickel) for promoting crystallization when crystallizing an amorphous silicon film.

Specifically, heat treatment is performed in a state in which the catalyst element is retained in the surface of the amorphous silicon film, thereby chancing the amorphous silicon film to a crystalline silicon film. The technique recorded in Embodiment 1 of the above patent is used in this embodiment of the present invention, but the technique recorded in Embodiment 2 of the patent may also be used. Note that single crystalline silicon films and polycrystalline silicon films are contained with the term crystalline silicon film, and that the crystalline silicon film formed in this embodiment is a silicon film having crystal boundaries.

Although depending upon the amount of hydrogen contained in the amorphous silicon film, it is preferable to perform dehydrogenation processing be heat treatment at 400 to 550° C. for several hours, thereby reducing the amount of contained hydrogen to 5 atomic % or less, and then performing crystallization. Further, other method of manufacturing the amorphous silicon film, such as sputtering or evaporation, may also be used: however, it is preferable to sufficiently reduce impurity elements such as oxygen and nitrogen contained within the film.

A known technique may be used on the amorphous silicon film 403 to form the crystalline silicon film (polysilicon film or polycrystalline silicon film) 404. Light emitted from a laser (hereafter referred to as laser light) is irradiated to the amorphous silicon film 403 in this embodiment to form the crystalline silicon film 404. (See FIG. 7C.) A pulse emission type or continuous emission type excimer laser may be used as the laser, and a continuous emission argon laser may also be used. Alternatively, the second harmonic, the third harmonic, or the fourth harmonic of an Nd:YAG laser or an Nd:YVO laser may also be used. In addition, the beam shape of the laser light may be a linear shape (including long and thin shapes) or a rectangular shape.

Furthermore, light emitted from a lamp (hereafter referred to as lamp light) may also be irradiated as a substitute for the laser light (hereafter referred to as lamp annealing). Lamp light emitted from a lamp such as a halogen lamp or an infrared lamp can be used as the lamp light.

A process of performing thermal processing (annealing) as above by laser light or lamp light is referred to as an optical annealing process. The optical annealing process is performed at a high processing temperature for a short time, and therefore the thermal process can be performed effectively and at high throughput for cases in which a substrate having low resistance to heat, such as a glass substrate, is used. Of course, the aim is to perform annealing, and therefore furnace annealing (thermal annealing) can also be performed by using an electric furnace as a substitute.

Laser annealing is performed in this embodiment using light from a pulse emission excimer laser formed into a linear shape. The laser annealing conditions are as follows: XeCl gas is used as an excitation gas; the processing temperature is set to room temperature; the pulse emission frequency is set to 30 Hz; and the laser energy density is from 250 to 500 mJ/cm$^2$ (typically between 350 and 400 mJ/cm$^2$).

Along with the complete crystallization of any amorphous regions remaining after thermal crystallization, laser annealing performed at the above conditions has an effect of lowering faults or the like in the crystalline regions already crystallized. This process can therefore also be referred to as a process for improving the crystallinity of the semiconductor film by optical annealing, and a process for promoting crystallization of the semiconductor film. It is also possible to obtain these types of effects by optimizing the lamp annealing conditions.

A protective film 405, used during subsequent impurity addition, is formed next on the crystalline silicon film 404. (See FIG. 7D.) The protective film 405 is formed using a silicon oxynitride film, or a silicon oxide film, having a thickness from 100 to 200 nm (preferably between 130 and 1701 nm). The protective film 405 is formed so that the crystalline silicon film 404 is not directly exposed to a plasma during impurity addition, and in order to make delicate temperature control possible.

Subsequently an impurity element which imparts p-type conductivity (hereafter referred to as a p-type impurity) is added through the protective film 405. Typically a periodic table group 13 element, usually boron or gallium, can be used as the p-type impurity element. This process (also referred to as a channel doping process) is one for controlling the TFT threshold voltage. Note that boron is added here by ion doping in which a plasma is excited using diborane ($B_2H_6$) without separation of mass. Ion implantation, in which mass separation is performed, may of course also be used.

A p-type impurity region (a) 406 containing a p-type impurity element (boron in this embodiment) at a concentration of $1 \times 10^{15}$ to $1 \times 10^{18}$ atoms/cm$^3$ (typically between $5 \times 10^{16}$ and $5 \times 10^{17}$ atoms/cm$^3$) is formed by this process. (See FIG. 7D.)

Next, after removing the protective film 405, unnecessary portions of the crystalline silicon film are removed, thereby forming an island-shape semiconductor film (hereafter referred to as an active layer) 407. (See FIG. 7E.)

A gate insulation film 408 is formed, covering the active lacer 407. (See FIG. 7F.) The gate insulation film 408 may be formed having a thickness of 10 to 200 nm, preferably from 50 to 150 nm. A silicon oxynitride film is formed having a thickness of 80 nm by plasma CVD using $N_2O$ and $SiH_4$ as raw materials.

Although not shown in the figures, a two layer lamination film of tungsten nitride (WN) having a thickness of 50 nm and tantalum (Ta) having a thickness of 350 nm is used as a gate wiring 409. (See FIG. 8A.) The gate wiring may also be formed by a single layer conductive film, but it is preferable to use a two layer or a three layer lamination film when necessary.

Note that an element selected from the group consisting of tantalum (Ta), titanium (Ti), molybdenum (Mo), tungsten (W), chromium (Cr), and silicon (Si), or an alloy film of a combination of the above-mentioned elements (typically an Mo—W alloy or an Mo—Ta alloy) can be used as the gate wiring.

Next, an n-type impurity element (phosphorous in this embodiment) is added in a self aligning manner with the gate wiring 409 as a mask. (See FIG. 8B.) The addition process is regulated so that phosphorous is added to an n-type impurity region (a) 410 thus formed at a concentration (typically from $1 \times 10^{16}$ to $5 \times 10^{18}$ atoms/cm$^3$, more typically between $3 \times 10^{17}$ and $3 \times 10^{18}$ atoms/cm$^3$) which is from 5 to 10 times higher than the boron concentration added by the channel doping process.

A resist mask 411 is formed, an n-type impurity element (phosphorous in this embodiment) is added, and an n-type impurity region (b) 412 containing a high concentration of phosphorous is formed. (See FIG. 8C.) Ion doping using phosphine ($PH_3$) is performed here (ion implantation may also be performed, of course), and the concentration of phosphorous in this region is set from $1\times10^{20}$ to $1\times10^{21}$ atoms/cm$^3$ (typically between $2\times10^{20}$ and $5\times10^{20}$ atoms/cm$^3$).

Further, phosphorous and boron which have been added in the previous process are already contained in regions in which the n-type impurity region (b) 412 is formed, but phosphorous is added at a sufficiently high concentration here, and therefore one need not consider the influence of phosphorous and boron already added by the prior steps.

Figure 8A:
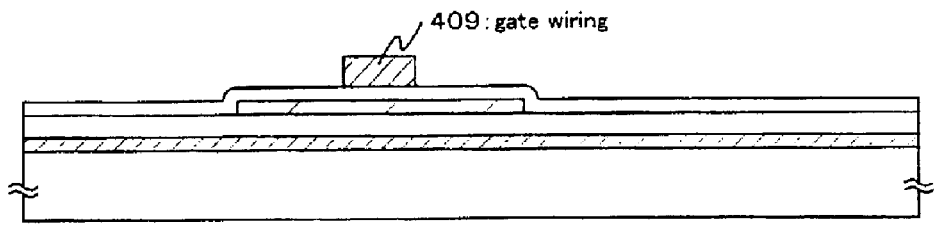
FIGS. 8A to 8D are diagrams showing an example of an embodiment of the present invention.
Figure 8B:
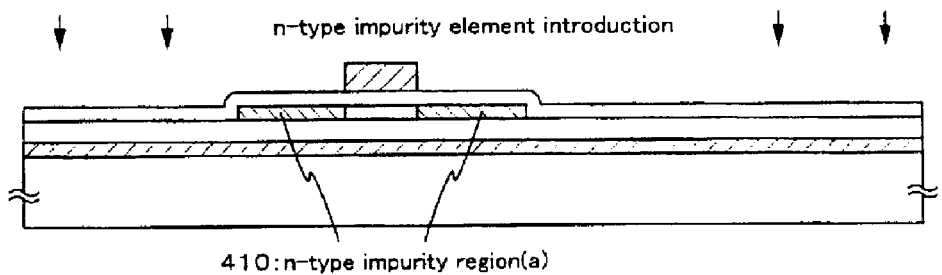

After removing the resist mask 411, a third insulation film 414 is formed. (See FIG. 8D.) An insulation film containing silicon, specifically a silicon nitride film, a silicon oxide film, a silicon oxynitride film, or a lamination film of a combination of these films, may be formed with a thickness of 600 nm to 1.5 μm as the third insulation film 414. A 1 μm thick silicon oxynitride film (with a nitrogen concentration from 25 to 50 atomic %) is formed in this embodiment using plasma CVD with SiH$_4$, N$_2$O, and NH$_3$ as raft material gasses.

A heat treatment process is performed next in order to activate the n-type and p-type impurity elements added at their respective concentration. (See FIG. 8D.) This process can be performed by furnace annealing, laser annealing, or rapid thermal annealing (RTA). The activation process is performed here by furnace annealing. The heat treatment process is performed within a nitrogen atmosphere at 300 to 650° C. preferably between 400 and 550° C. Heat treatment is performed here for 4 hours at 550° C.

Figure 8C:
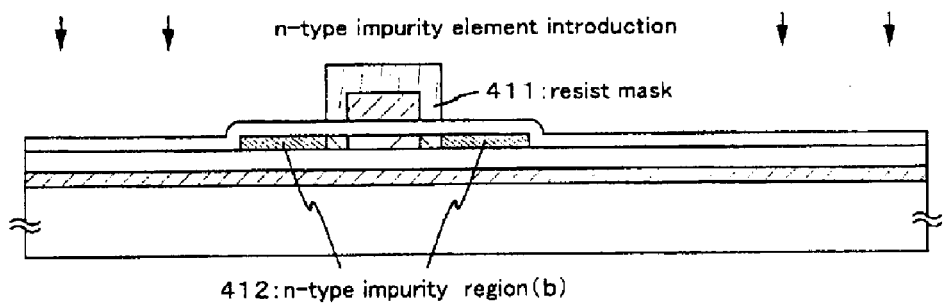
Figure 8D:
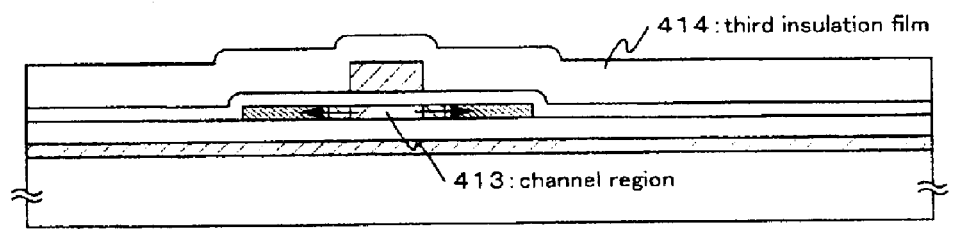

The catalyst element used in crystallizing the amorphous silicon film (nickel in this embodiment) moves in the direction shown by the arrow at this point in this embodiment, and is captured (gettered) in the n-type impurity region (b) 412 containing a high concentration of phosphorous and which is formed by the step shown in FIG. 8C. This is a phenomena caused by the gettering effect of metallic elements by phosphorous, and as a result, the concentration of the catalyst element in a channel region 413 becomes less than or equal to $1\times10^{17}$ atoms/cm$^3$ (preferably less than or equal to $1\times10^{16}$ atoms cm$^3$).

Conversely, the catalyst element is segregated in a high concentration in a region which becomes a gettering site for the catalyst element (the n-type impurity region (b) 412 formed by the step shown in FIG. 8C), and the catalyst element exists there at a concentration greater than or equal to $5\times10^{18}$ atoms cm$^3$ (typically from $1\times10^{19}$ to $5\times20^{20}$ atoms cm$^3$).

In addition, heat treatment is performed at a temperature of 300 to 450° C. for 1 to 12 hours in an atmosphere containing between 3 and 100% hydrogen, thereby performing a hydrogenation process on the active layer. This process is one of terminating dangling bonds in the semiconductor layer by hydrogen which is thermally excited. Plasma hydrogenation (using hydrogen which is excited by a plasma) ma also be performed as another means of hydrogenation.

An opening portion 415 for reaching a source region and a drain region of the TFT (see FIG. 9A) and source and drain wirings 416 are formed. (See FIG. 9B.) Further, although not shown in the figures, in this embodiment, the wirings are three layer structure lamination films in which a 100 nm Ti film, a 300 nm aluminum film containing Ti, and a 150 nm Ti film are formed in succession by sputtering.

A silicon nitride film, a silicon oxide film, or a silicon oxynitride film is formed next at a thickness of 50 to 500 nm (typically between 200 and 300 nm) as a passivation film 417. (See FIG. 9C.) Plasma processing is performed earlier than film formation in this embodiment using a gas containing hydrogen such as H$_2$, NH$_3$ and the like, and heat treatment processing is performed after the film formation. Hydrogen excited by this preprocess is supplied throughout the third insulation film 414. By performing heat treatment in this state, the film quality of the passivation film 417 is improved, and the amount of hydrogen added to the third insulation film 414 diffuses to the lower side, and therefore the activation layer can be effectively hydrogenated.

Further, additional hydrogenation processing may also be performed after forming the passivation film 417. For example, heat treatment may be performed for 1 to 12 hours at 300 to 450° C. in an atmosphere containing between 3 and 100% hydrogen. Alternatively, a similar effect can also be obtained by using plasma hydrogenation.

A fourth insulation film 418 made from an organic resin is then formed having a thickness of approximately 1 μm as a leveling film. (See FIG. 9C.) Materials such as polyimide, acrylic, polyamide, polyimide amide, and BCB (benzocyclobutene) can be used as the organic resin. The following can be given as advantages of using an organic resin film: the film formation method is simple; the dielectric constant is low, and therefore the parasitic capacitance is low; and there is superior levelness. Note that organic resin films other than those stated above, such as organic SiO compounds, can also be used. A thermal polymerization type polyimide is used here, and it is formed by tiring at 300° C. after application to the substrate.

A second substrate 419 is prepared next. An adhesive 420 is applied to regions in which the thin film device is not formed when the second substrate 419 is joined to the first substrate 400, and a viscous adhesive 421 is applied to other regions so that a polarization film 422 does not move. (See FIG. 9D.)

A glass substrate, a quartz substrate, and in addition, substrates such as a silicon substrate, a metallic substrate, and a stainless steel substrate can be used as the second substrate 419. Further, the adhesive 420 bonds portions which are later cut away (regions in which the thin film device is not formed), and therefore it is not necessary for the adhesive 420 to be transparent. One having resistance to heat may be selected. For example, there are polyvinyl alcohol (PVA) adhesives generally used in bonding polarization films. An adhesive having resistance to heat and which is transparent is effectively used as the viscous adhesive 421, and acrylics, urethanes, and silicon adhesives can be given as viscous adhesives.

Figure 10A:
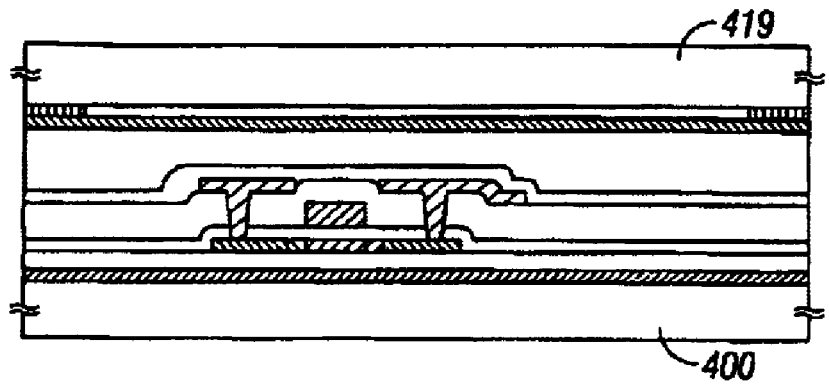
FIGS. 10A to 10C are diagrams showing an example of an embodiment of the present invention.

The surface of the first substrate 400 on which the TFT is formed, and the surface of the second substrate 419 to which the polarization film is attached, are bonded in FIG. 10A. A transparent, heat resistant adhesive, a polyvinyl alcohol (PVA) adhesive, for example, may be used as the adhesive.

The first substrate 400 is then cut away using means such as back grinding or CMP, with the thin film device retained on the second substrate 419. (See FIG. 10B.) A quartz substrate is used as the first substrate 400, and a nitride film is used as the etching stopper 401 in this embodiment, and therefore wet etching using hydrofluoric acid is performed as a final removal means. Note that portions of the first substrate 400 may be left when patterning using wet etching, and that these portions can be used as liquid crystal display device spacers. Further, the etching stopper 401 made from a nitride film may also be removed subsequently by dry etching in this embodiment.

An opening portion is formed next in the first insulation film 402 in order to make the to a pixel electrode, and a pixel electrode 423 is formed. (See FIG. 10B.) The pixel electrode 423 may be formed by using, a transparent conductive film for cases in which a transmission type liquid crystal display device is formed, and by using a metallic film for cases in which a reflection type liquid crystal display device is formed. A transmission type liquid crystal display device is formed here, and therefore a 110 nm thick indium oxide and tin oxide (ITO) film is formed by sputtering.

Figure 9A:
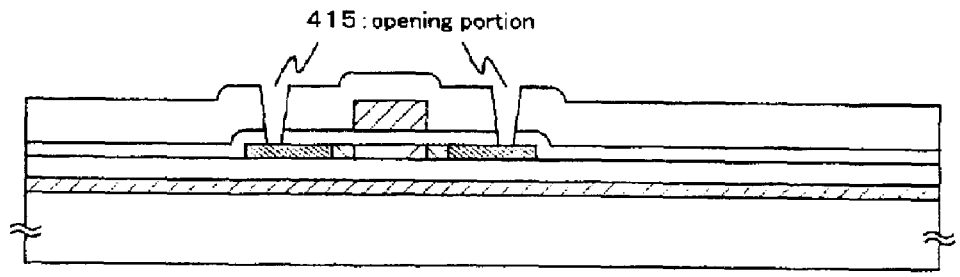
FIGS. 9A to 9D are diagrams showing an example of all embodiment of the present invention.
Figure 9B:
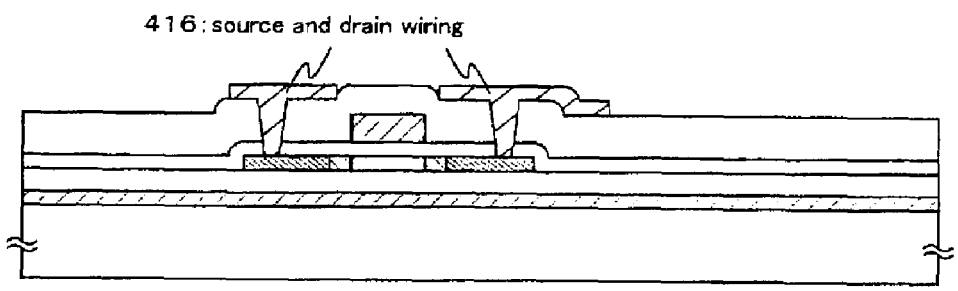

Further, there is a method of forming the conductive connection by the source and drain wirings 416 of FIG. 9B when an opening portion for reaching the etching stopper 401 is formed in portions other than the active layer when opening the opening portion 415 for reaching the source and drain regions of the TFT in FIG. 9A. If this method is used, portions other than the active layer are made conductive, and therefore the aperture ratio of the pixel drops, but the pixel electrode 423 can be made level.

Next, although not shown in the figures, an orientation film is formed using a polyimide film, a rubbing process is performed, and the liquid crystal molecules are given a certain, fixed pre-tilt angle and oriented. An opposing electrode 425 is then formed on a polarization film 426, and these are joined using a sealing material, spacers, and the like (both not shown in the figures) in accordance with a known cell construction process. Liquid crystals 424 are then sealed using a sealant 427. (See FIG. 10C.) Note that it is preferable to form a shielding film on the polarization film 422 if the incidence direction for light is that of light 1. Further, it is preferable to form a film which becomes a light shielding film above or below the first insulation film 402 for cases in which the light incidence direction is light 2. Known liquid crystal materials may be used for the liquid crystals. Note that one more supporting material similar to the second substrate 419 may also be prepared for cases in which the polarization film 426 warps. Color filters and shielding films may also be formed when necessary in the opposing polarization film 426.

Figure 11A:
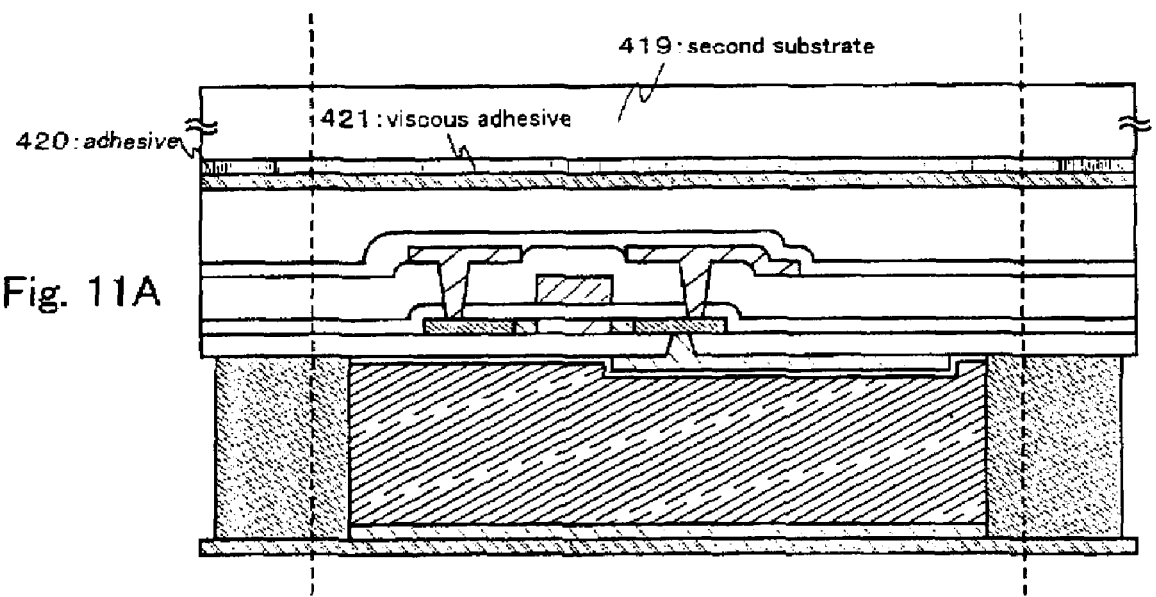
FIGS. 11A and 11B are diagrams showing an examples of all embodiment of the present invention.
Figure 11B:
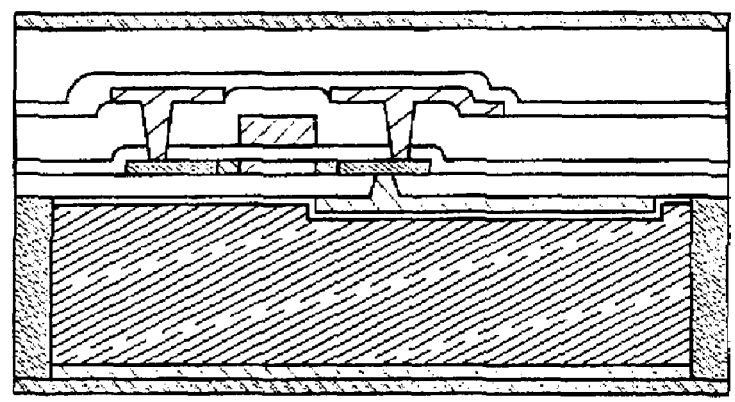

Next, as shown in FIG. 11A, portions bonded by the adhesive 420 are cut. Only portions bonded by the viscous adhesive 421 remain, and therefore the second substrate 419 is peeled off, and a thin, light weight, flexible active matrix liquid crystal display device is complete. (See FIG. 11B.)

Figure 12:
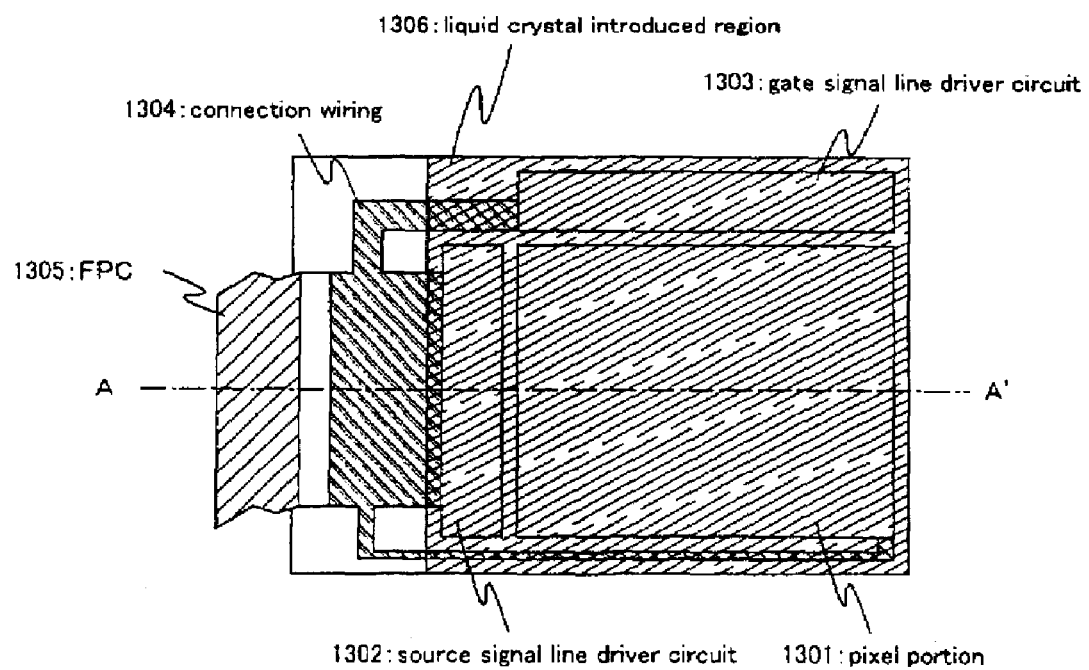
FIG. 12 is a diagram showing an example of an embodiment of the present invention.

In addition, an example of a liquid crystal display device in which driver circuit is integrated and manufactured together with the liquid crystal display device using the manufacturing method of the present invention is shown in FIG. 12. FIG. 12 is a diagram showing a state after a source signal line driver circuit 1302, a gate signal line driver circuit 1303, and transistors structuring a pixel portion 1301 are formed on a first substrate, after which a second substrate is bonded, the first substrate is removed, and liquid crystals are introduced (liquid crystal introduced region 1306), as seen from the liquid crystal side.

The liquid crystal display device shown in FIG. 12 is structured by the pixel portion 1301, the source signal line driver circuit 1302, and the gate signal line driver circuit 1303). The pixel portion 1301 is an n-channel TFT, and the driver circuits formed in the periphery are structured by CMOS circuits as basic elements. The source signal line driver circuit 1302 and the gate signal line driver circuit 1303 are connected to all FPC (flexible printed circuit) 1305 by using a connection wiring 1304, and signals from external driver circuits are received.

Figure 13:
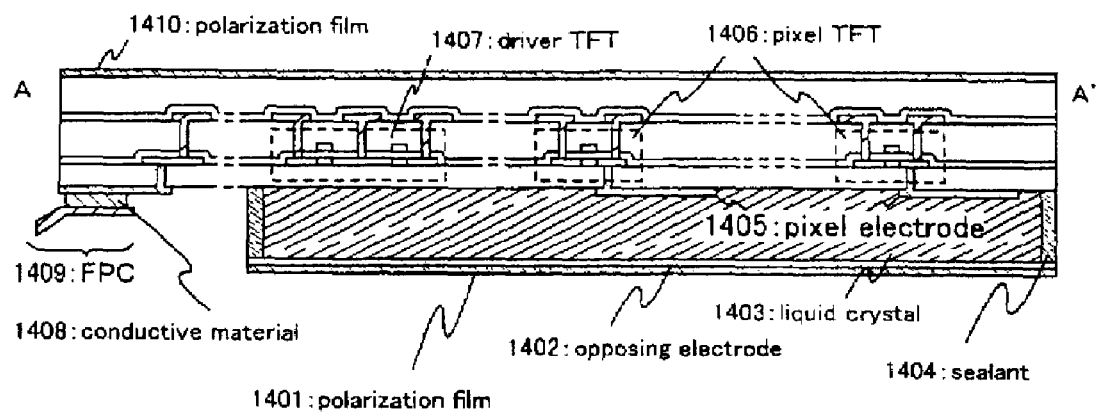
FIG. 13 is a diagram showing an example of an embodiment of the present invention.

A cross sectional diagram of FIG. 12 cut along the line A-A' is shown in FIG. 13. Liquid crystals 1403, surrounded by a polarization film 1401, an opposing electrode 1402, and a sealant 1404, are below a pixel electrode 1405) connected to a pixel TFT 1406. The liquid crystals 1403 are also below the driver TFT 1407 in this case, but the liquid crystals 1403 may also be arranged only under the pixel electrode 1405 for cases when one wishes to reduce parasitic capacitance. Signals from an FPC 1409 bonded by a conductive material 1408 are input to the driver TFT 1407. The structure functions as a transmission type display device by forming a polarization film 1410 on the opposite side of the polarization film 1401, with respect to the liquid crystals 1403.

Embodiment 2

An example of a three dimensional package in which thin film devices formed using the present invention are overlapped is explained simply in this embodiment using figures.

Figure 9C:
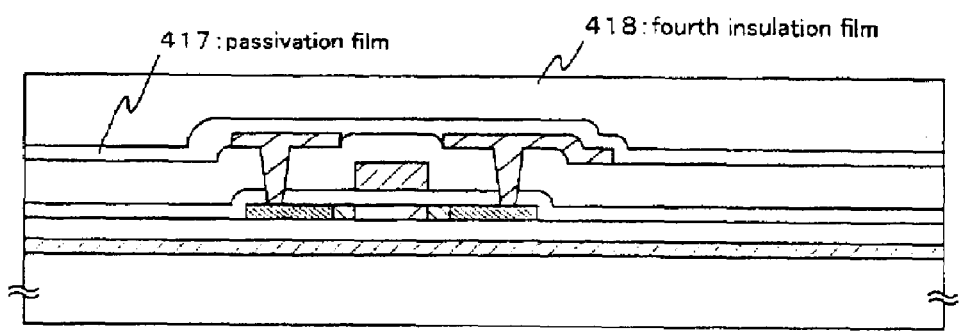
Figure 9D:
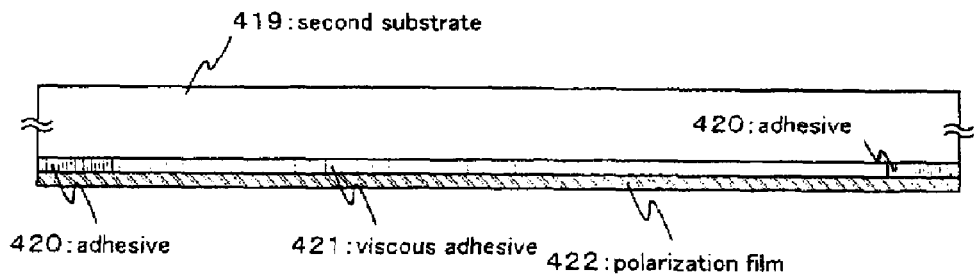
Figure 14A:
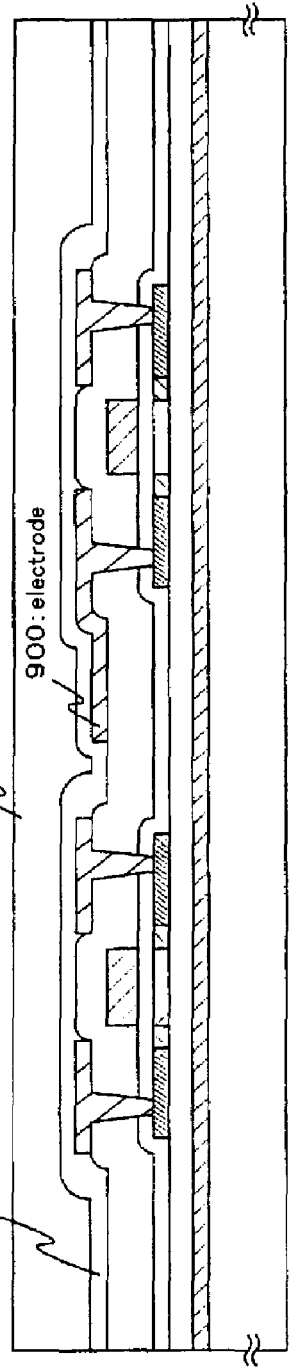
FIGS. 14A to 14C are diagrams showing an example of an embodiment of the present invention.

Up through the processes of FIG. 9C is similar to Embodiment 1, and therefore an explanation of those portions is omitted. FIG. 14A is a state nearly identical to FIG. 9A, but the source and drain wiring 416 is extended, thereby forming an electrode 900. Note that two transistors are shown for the explanation, and portions common to Embodiment 1 use the same reference numerals as Embodiment 1.

Figure 14B:
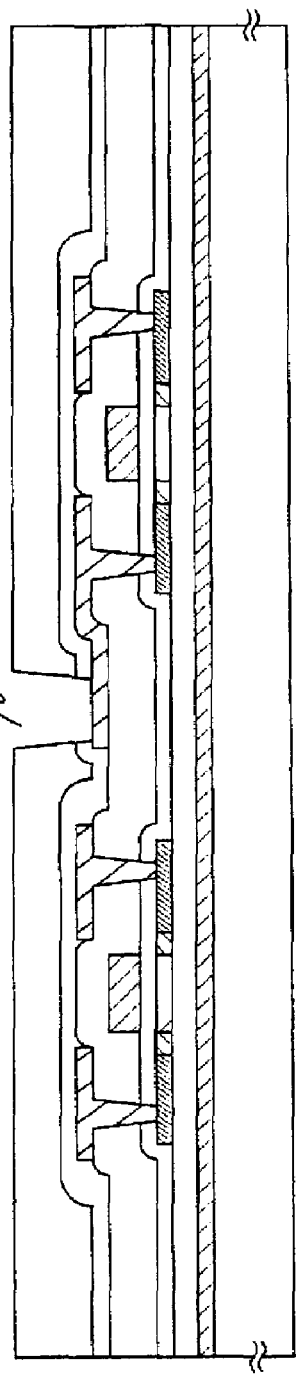
Figure 14C:
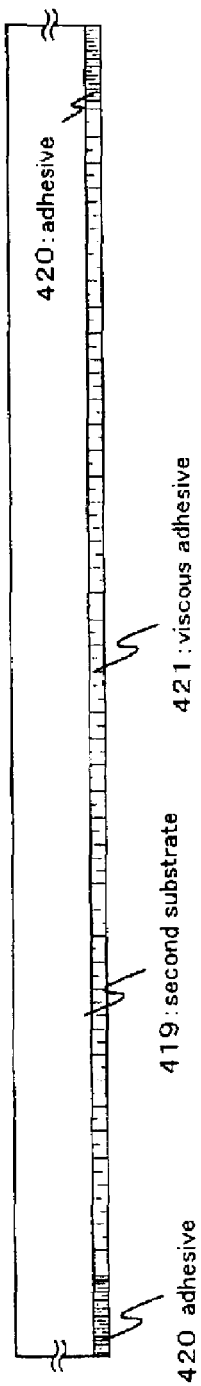
Figure 15A:
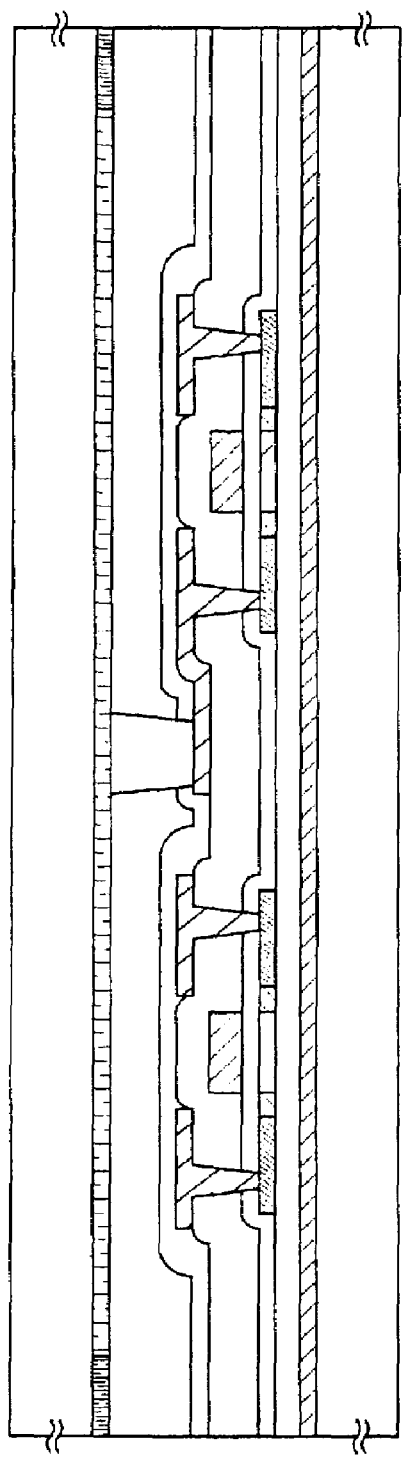
FIGS. 15A and 15B are diagrams showing an example of an embodiment of the resent invention.

An opening portion 901 is formed here, and left such that the conductive connection can be made with the electrode 900. (See FIG. 14B.) The adhesive 420 and the viscous adhesive 421 are applied to the second substrate 419, but the polarization film is not necessary. (See FIG. 14C.) The polarization film is not necessary, but a thin plate, protection film, and the like can be used in order to maintain rigidity. In this case, an opening portion is formed in the thin plate or protecting film in advance in a position corresponding to the opening portion 901. The surface of the first substrate 400 on which the thin film device is formed, and the second substrate 419, are bonded using the adhesive 420 and the viscous adhesive 421 in FIG. 15A.

Figure 15B:
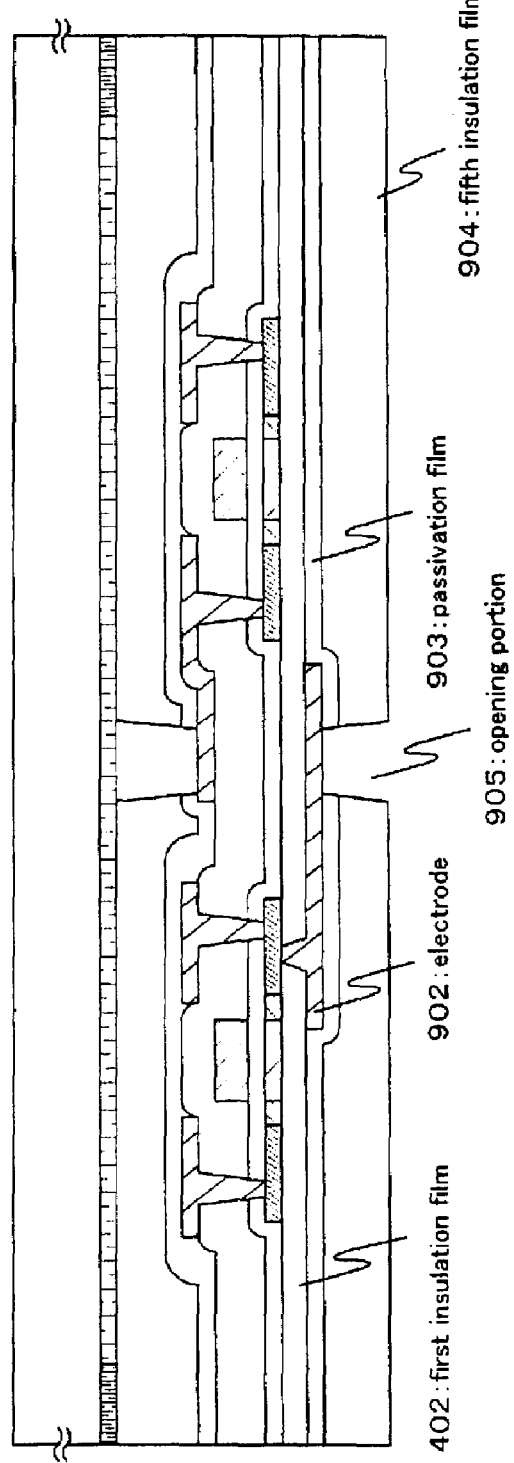

Similar to Embodiment 1, the first substrate 400 and the etching stopper 401 are removed. An opening portion is formed in the first insulation film 402, and an electrode 902 is formed. A passivation film 903 and a fifth insulation film 904 are formed with covering the electrode 902, and an opening portion 905 is formed so that the conductive connection to the electrode 902 can be made. The passivation film 903 may be formed using a silicon nitride film, a silicon oxide film, or a silicon oxynitride film at a thickness of 50 to 500 nm, (typically between 200 and 300 nm), similar to the passivation film 417 of Embodiment 1. The fifth insulation film 904 is similar to the fourth insulation film 418 of Embodiment 1, and it provides leveling as well as being a protective film. The state of FIG. 15B is thus reached by performing the processes through here.

The second substrate 419 is then removed by the same method as that of Embodiment 1. A plurality of the thin film devices formed by processing up through this point are manufactured, and conductive connections are made between electrodes by using a conductive paste 906. If the thin film devices are then overlapped and joined, a semiconductor device packaged in three dimensions is complete. (See FIG. 16.) Large capacity, small size, and light weight have been sought for memory in recent years, and the utilization of techniques for three dimensional packaging are in the spotlight. Semiconductor devices that are packaged in three dimensions can easily be realized, without making the process steps more complex, if the present invention is used. Note that the joined thin film devices are shown in FIG. 16 with conductive connections made through the source and drain regions of the thin film transistors, but direct connections of wirings may also be made.

Embodiment 3

A semiconductor device using thin film transistors (TFTs) which use semiconductor thin films formed on an insulator in their active layers is explained in this embodiment. Note that, although a cross section of one thin film transistor portion and wirings is shown in the figures in order to explain the positional relationships such as those between wirings and an active layer, and between wirings and insulation films, the present invention can also be applied to an integrated circuit having a plurality of thin film transistors.

Figure 17A:
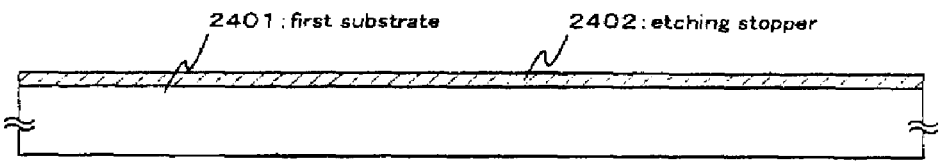
FIGS. 17A to 17E are diagrams showing an example of an embodiment of the present invention.

A glass substrate or a quartz substrate can be used as a first substrate 2401 in FIG. 17A. In addition, substrates having an insulation film formed on their surfaces, such as a silicon substrate, a metallic substrate, or a stainless steel substrate, can also be used.

An etching stopper 2402 is formed next for removal of the first substrate 2401. A material having a selectivity which is sufficiently large with respect to the first substrate is used for the etching stopper 2402. A quartz substrate is used as the first substrate 2401, and a nitride film having a thickness of 10 to 1000 nm (typically between 100 and 500 nm) is formed as the etching stopper 2402 in this embodiment.

A lower portion insulation film 2403 is formed on the etching stopper 2402 from a 10 to 100 nm thick (typically 300 to 500 nm thick) silicon oxide film. Further, a silicon oxynitride film may also be used.

Figure 17B:
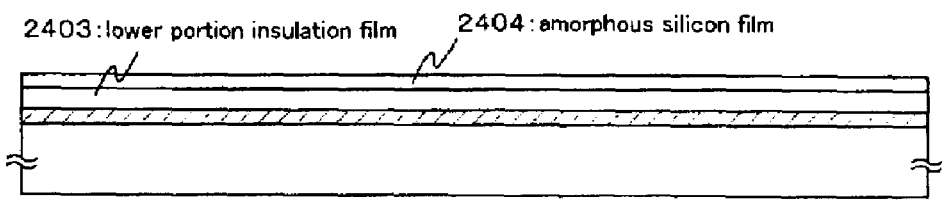

Subsequently, a 10 to 100 nm thick amorphous semiconductor film (an amorphous silicon film 2404 in this embodiment) is formed by a known film formation method on the lower portion insulation film 2403. (See FIG. 17B.) Note that, in addition to the amorphous silicon film, an amorphous compound semiconductor film such as amorphous silicon germanium can also be used as the amorphous semiconductor film.

A semiconductor film containing a crystalline structure (a crystalline silicon film 2405 in this embodiment) is then formed in accordance with the technique recorded in Japanese Patent Application Laid-open No. 7-130652 (U.S. Pat. No. 5,643,826). The technique recorded in the above patent is a means of crystallization using a catalyst element (one element, or a plurality of elements, selected from the group consisting of nickel, cobalt, germanium, tin, lead, palladium, iron, and copper, typically nickel) for promoting crystallization when crystallizing an amorphous silicon film.

Specifically, heat treatment is performed in a state in which the catalyst element is retained in the surface of the amorphous silicon film, thereby changing the amorphous silicon film to a crystalline silicon film. The technique recorded in Embodiment 1 of the above patent is used in this embodiment of the present invention, but the technique recorded in Embodiment 2 of the patent may also be used. Note that single crystalline silicon films and polycrystalline silicon films are contained with the term crystalline silicon film, and that the crystalline silicon film formed in this embodiment is a silicon film having crystal rain boundaries.

Although depending upon the amount of hydrogen contained in the amorphous silicon film, it is preferable to perform dehydrogenation processing by heat treatment at 400 to 550° C. for several hours, thereby reducing the amount of contained hydrogen to 5 atomic % or less, and then performing crystallization. Further, other method of manufacturing the amorphous silicon film, such as sputtering or evaporation, may also the used: however, it is preferable to sufficiently reduce impurity elements such as oxygen and nitrogen contained within the film.

Figure 17C:
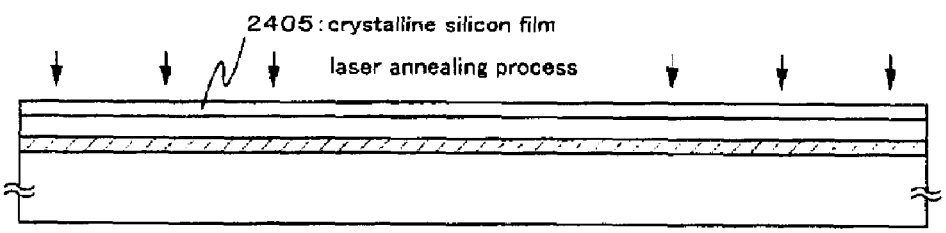

A known technique may be used on the amorphous silicon film 2404 to form the crystalline silicon film (polysilicon film or polycrystalline silicon film) 2405. Light emitted from a laser (hereafter referred to as laser light) is irradiated to the amorphous silicon film 2404 in this embodiment, forming the crystalline silicon film 2405. (See FIG. 17C.) A pulse emission type or continuous emission type excimer laser may be used as the laser, and a continuous emission argon laser may also be used. Alternatively, the second harmonic, the third harmonic, or the fourth harmonic of an Nd:YAG laser or an Nd:YVO laser may also be used. In addition, the beam shape of the laser light may be a linear shape (including long and thin shapes) or a rectangular shape.

Furthermore, light emitted from a lamp (hereafter referred to is lamp light) may also be irradiated as a substitute for laser light (hereafter referred to as lamp annealing). Lamp light emitted from a lamp such as a halogen lamp or an infrared lamp can be used is the lamp light.

A process of performing thermal processing (annealing) as above by laser light or lamp light is referred to as an optical annealing process. The optical annealing process is performed at a high processing temperature for a short time, and therefore the thermal process can be performed effectively and at high throughput for cases in which a substrate having low resistance to heat, such as a glass substrate, is used. Of course, the aim is to perform annealing, and therefore furnace annealing (thermal annealing) can also be performed by using an electric furnace as a substitute.

Laser annealing is performed in this embodiment using light from a pulse emission excimer laser formed into a linear shape. The laser annealing conditions are as follows: XeCl gas is used as an excitation gas; the processing temperature is set to room temperature; the pulse emission frequency is set to 30 Hz; and the laser energy density is from 250 to 500 mJ/cm$^2$ (typically between 350 and 400 mJ/cm$^2$).

Along with the complete crystallization of any amorphous regions remaining after thermal crystallization, laser annealing performed at the above conditions has an effect of lowering faults in the crystalline regions already crystallized. This process can therefore also be referred to as a process for improving the crystallinity of the semiconductor film by optical annealing, and a process for promoting crystallization of the semiconductor film. It is also possible to obtain these types of effects by optimizing the lamp annealing conditions.

Figure 17D:
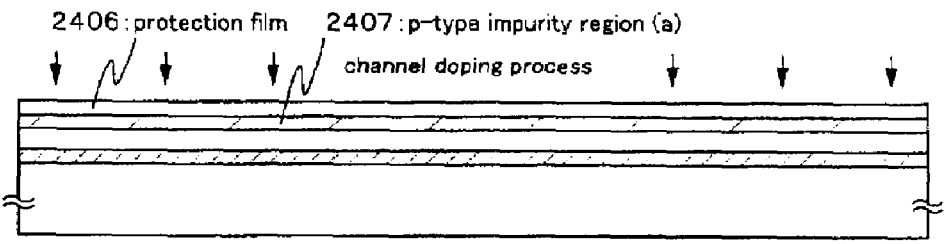

A protective film 2406, used during subsequent impurity addition, is formed next on the crystalline silicon film 2405. (See FIG. 17D.) The protective film 2406 is formed using a silicon oxynitride film, or a silicon oxide film, having a thickness from 100 to 200 nm (preferably between 130 and 170 nm). The protective film 2406 is formed so that the crystalline silicon film 2405 is not directly exposed to a plasma during impurity addition, and in order to make delicate temperature control possible.

Subsequently, an impurity element which imparts p-type conductivity (hereafter referred to as a p-type impurity) is added through the protective film 2406. Typically a periodic table group 13 element, usually boron or gallium, can be used as the p-type impurity element. This process (also referred to as a channel doping process) is one for controlling the TFT threshold voltage. Note that Boron is added here by ion doping in which a plasma is excited using diborane ($B_2H_6$) without separation of mass. Ion implantation, in which mass separation is performed, may of course also be used.

A p-type impurity region (a) 2407 containing a p-type impurity element (boron in this embodiment) at a concentration of $1 \times 10^{15}$ to $1 \times 10^{18}$ atoms/cm$^3$ (typically between $5 \times 10^{16}$ and $5 \times 10^{17}$ atoms/cm$^3$) is formed by this process. (See FIG. 17D.)

Figure 17E:
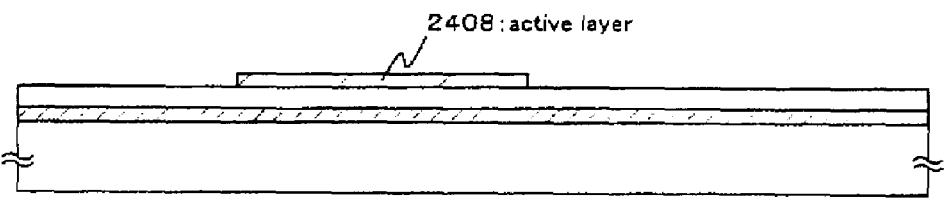

Next, after removing the protective film 2406, unnecessary portions of the crystalline silicon film are removed to form an island-shape semiconductor film (hereafter referred to as an active layer) 2408. (See FIG. 17E.)

Figure 18A:
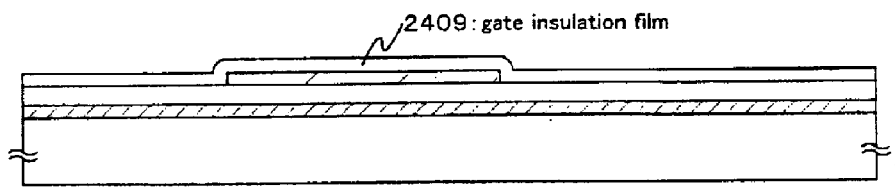
FIGS. 18A to 18D are diagrams showing an example of an embodiment of the present invention.

A gate insulation film 2409 is formed with covering the active layer 2408. (See FIG. 18A.) The gate insulation film 2409 may be formed having a thickness of 10 to 200 nm, preferably from 50 to 150 nm. A silicon oxynitride film is formed having a thickness of 80 nm by plasma CVD using $N_2O$ and $SiH_4$ as raw materials.

Figure 18B:
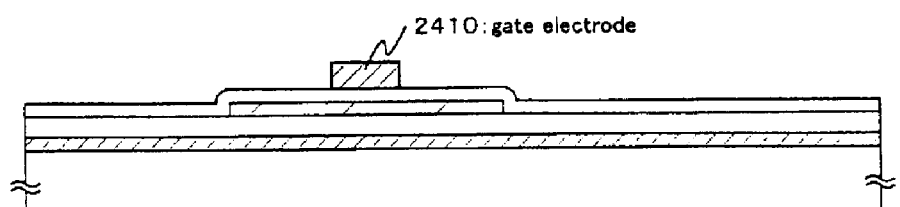

Although not shown in the figures, a two layer lamination film of 50 nm of tungsten nitride (WN) film and 350 nm of tantalum (Ta) is used as a gate electrode 2410. (See FIG. 18B.) The gate electrode mar also be formed by a single layer conductive film, but it is preferable to use a two layer or a three layer lamination film when necessary.

Note that an element selected from the group consisting of tantalum (Ta), titanium (Ti), molybdenum (Mo), tungsten (W), chromium (Cr), and silicon (Si), or an alloy film of a combination of the above-mentioned elements (typically an Mo—W alloy or an Mo—Ta alloy) can be used as the gate electrode.

Next, an n-type impurity element (phosphorous in this embodiment) is added in a self aligning manner with the gate wiring 2410 as a mask. (See FIG. 18C.) The addition process is regulated so that phosphorous is added to an n-type impurity region (a) 2411 thus formed at a concentration (typically from $1\times10^{16}$ to $5\times10^{18}$ atoms/cm$^3$, more typically between $3\times10^{17}$ and $3\times10^{18}$ atoms/cm$^3$) which is from 5 to 10 times higher than the boron concentration added by the channel doping process.

A resist mask 2412 is formed, an n-type impurity element (phosphorous in this embodiment) is added, and an n-type impurity region (b) 2413 containing a high concentration of phosphorous is formed. (See FIG. 18D.) Ion doping using phosphine ($PH_3$) is performed here (ion implantation may also be performed, of course), and the concentration of phosphorous in this region is set from $1\times10^{20}$ to $1\times10^{21}$ atoms cm$^3$ (typically between $2\times10^{20}$ and $5\times10^{20}$ atoms/cm$^3$).

Further, phosphorous and boron which have been added in the previous process are already contained in regions in which the n-type impurity region (b) 2413 is formed, but phosphorous is added at a sufficiently high concentration here, and therefore one need not consider the influence of phosphorous and boron already added by the prior steps.

Figure 19A:
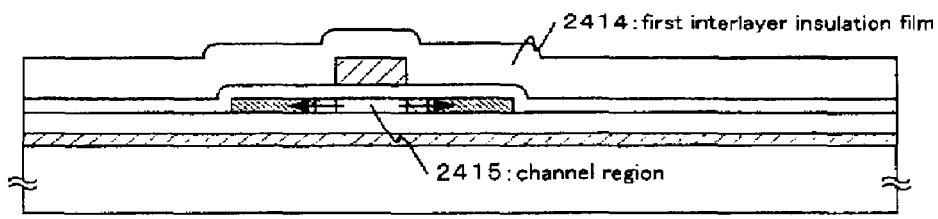
FIGS. 19A to 19D are diagrams showing an example of an embodiment of the present invention.

After removing the resist mask 2412, a first interlayer insulating film 2414 is formed (See FIG. 19A.) An insulation film containing silicon, specifically a silicon nitride film, a silicon oxide film, a silicon oxynitride film, or a lamination film of a combination of these films, may be formed with a thickness of 600 nm to 1.5 µm as the first interlayer insulating film 2414. A 1 µm thick silicon oxynitride film (with a nitrogen concentration from 25 to 50 atomic %) is formed in this embodiment using plasma CVD with $SiH_4$, $N_2O$, and $NH_3$ as raw material gasses.

A heat treatment process is performed next in order to activate the n-type and p-type impurity elements added at their respective concentrations. (See FIG. 19A.) This process can be performed by furnace annealing, laser annealing, or rapid thermal annealing (RTA). The activation process is performed here by furnace annealing. The heat treatment process is performed within a nitrogen atmosphere at 300 to 650° C., preferably between 400 and 550° C. Heat treatment is performed here for 4 hours at 550° C.

Figure 18C:
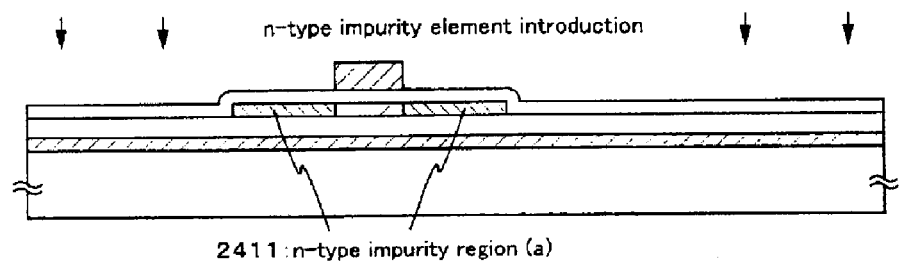
Figure 18D:
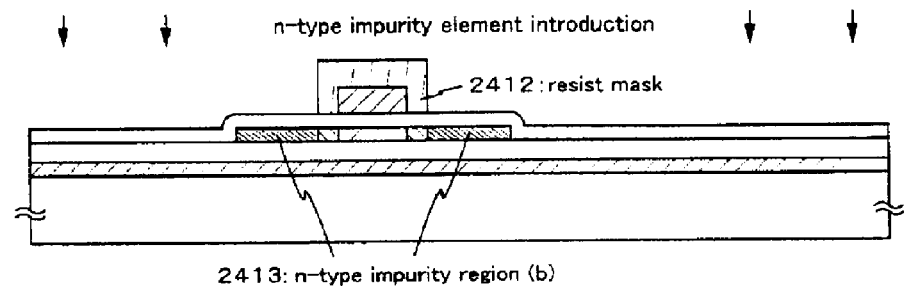

The catalyst element used in crystallizing the amorphous silicon film (nickel in this embodiment) moves in the direction shown by the arrow at this point in this embodiment, and is captured (gettered) in the n-type impurity region (b) 2413 containing a high concentration of phosphorous and which is formed by the step shown in FIG. 18D. This is a phenomena caused by the gettering effect of metallic elements by phosphorous, and as a result, the concentration of the catalyst element in a channel region 2415 becomes less than or equal to $1\times10^{17}$ atoms/cm$^3$ (preferably less than or equal to $1\times10^{16}$ atoms cm$^3$).

Conversely, the catalyst element is segregated in a high concentration in a region which becomes a gettering site for the catalyst element (the n-type impurity region (b) 2413 formed by the step shown in FIG. 18D), and the catalyst element exists there at a concentration greater than or equal to $5\times10^{18}$ atoms/cm$^3$ (typically from $1\times10^{19}$ to $5\times20^{20}$ atoms/cm$^3$).

In addition, heat treatment is performed at a temperature of 300 to 450° C. for 1 to 12 hours in an atmosphere containing between 3 and 100% hydrogen, thereby performing a hydrogenation process on the active layer. This process is one of terminating dangling bonds in the semiconductor layer by hydrogen which is thermally excited. Plasma hydrogenation (using hydrogen which is excited by a plasma) may also be performed as another means of the hydrogenation.

Figure 19B:
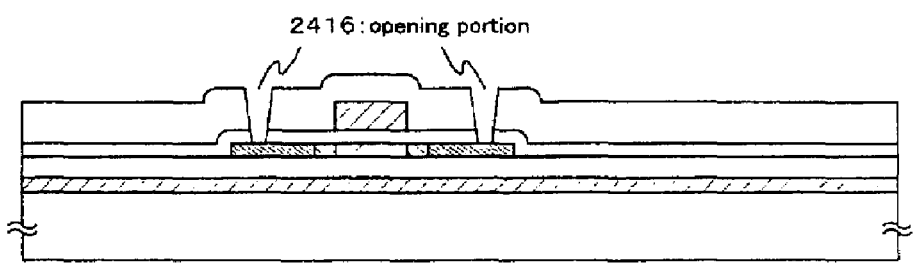
Figure 19C:
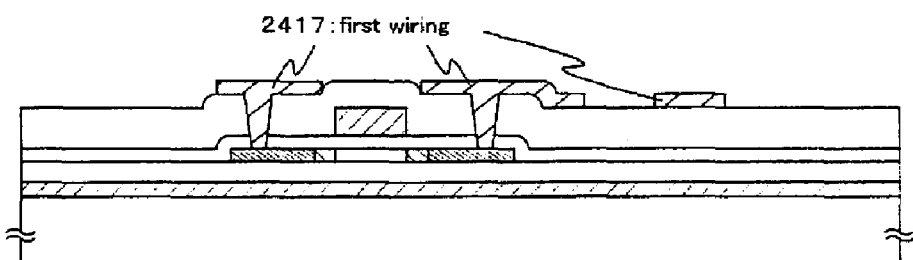

An opening portion 2416 for reaching a source region and a drain region of the TFT (see FIG. 19B), and first wirings 2417 are formed. (See FIG. 19C.) Further, although not shown in the figures, in this embodiment, the first wirings are a three layer structure lamination films in which a 100 nm Ti film, a 300 nm aluminum film containing Ti, and a 150 nm Ti film are formed in succession by sputtering.

Figure 19D:
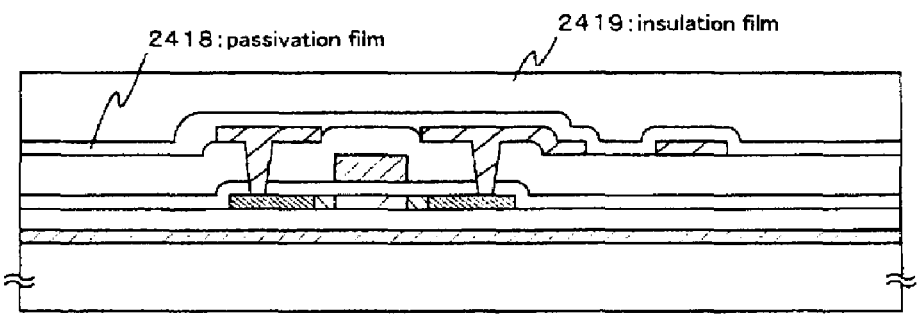

A silicon nitride film, a silicon oxide film, or a silicon oxynitride film is formed next at a thickness of 50 to 500 nm (typically between 200 and 300 nm) as a passivation film 2418. (See FIG. 19D.) Plasma processing is performed in advance in this embodiment using a gas containing hydrogen such as $H_2$, $NH_3$ and the like, and heat treatment processing is performed after film formation. Hydrogen excited by this preprocess is supplied throughout the first interlayer insulating film 2414. By performing heat treatment in this state, the film quality of the passivation film 2418 is improved, and the amount of hydrogen added to the first interlayer insulating film 2414 diffuses to the lower side, and therefore the activation layer can be effectively hydrogenated.

Further, additional hydrogenation processing may also be performed after forming the passivation film 2418. For example, heat treatment may be performed for 1 to 12 hours at 300 to 450° C. in an atmosphere containing between 3 and 100% hydrogen. Alternatively, similar effect can also be obtained by using plasma hydrogenation.

A insulation film 2419 made from an organic resin is then formed having a thickness of approximately 1 µm as a leveling film. (See FIG. 19D.) Materials such as polyimide, acrylic, polyamide, polyimide amide, and BCB (benzocyclobutene) can be used as the organic resin. The following can be given as advantages of using an organic resin film: the film formation method is simple; the dielectric constant is low, and therefore the parasitic capacitance is low; and there is superior levelness. Note that organic resin films other than those stated above, such as organic SiO compounds, can also be used. A thermally polymerization type polyimide is used here, and it is formed by firing at 300° C. after application to the substrate.

A second substrate 2420 is prepared next, and bonded to the surface of the first substrate 2401 on which the thin film device is formed. A glass substrate, a quartz substrate, and in addition, substrates such as a silicon substrate, a metallic substrate, and a stainless steel substrate can be used as the second substrate 2420 here. A quartz substrate is used as the second substrate 2420 in this embodiment. Adhesives such as epoxies, cyanoacrylates, and light hardening adhesives can be used as the adhesive here.

Figure 20A:
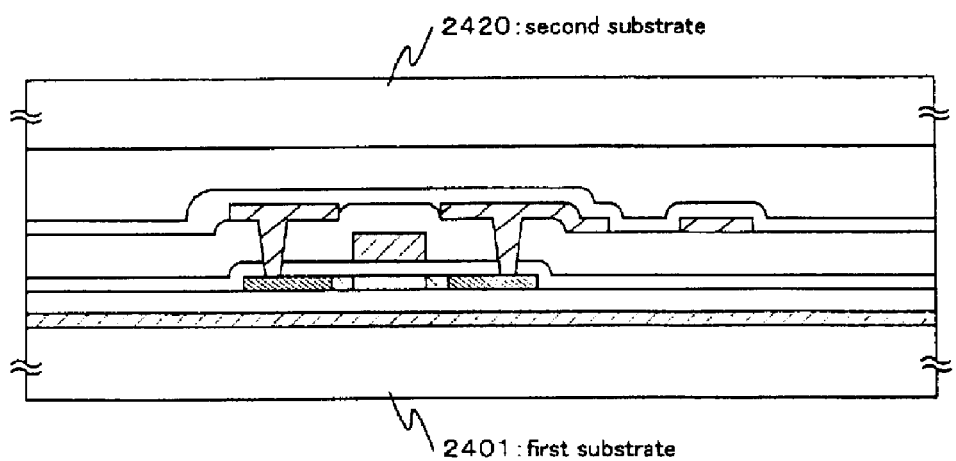
FIGS. 20A to 20C are diagrams showing an example of an embodiment of the present invention.
Figure 20B:
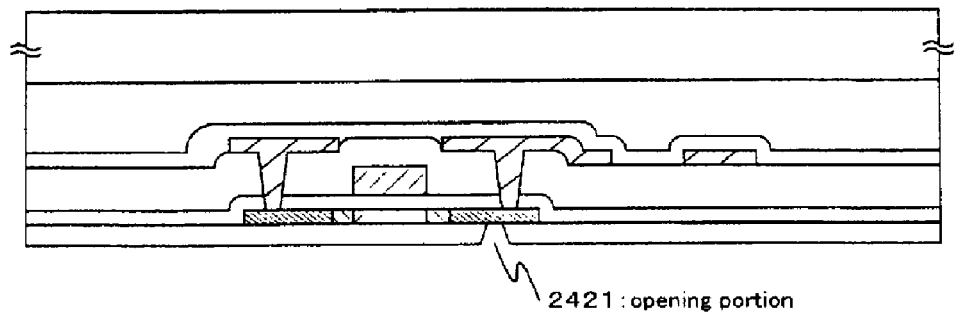

The first substrate 2401 is then cut away using means such as back grinding or CMP (chemical mechanical polishing), with the thin film device retained on the second substrate 2420. (See FIG. 20B.) A quartz substrate is used as the first substrate 2401, and a nitride film is used as the etching stopper 2402 in this embodiment, and therefore wet etching using hydrofluoric acid is performed after grinding to a suitable thickness. Further, the nitride film etching stopper 2402 may also be removed subsequently by dry etching in this embodiment.

Figure 20C:
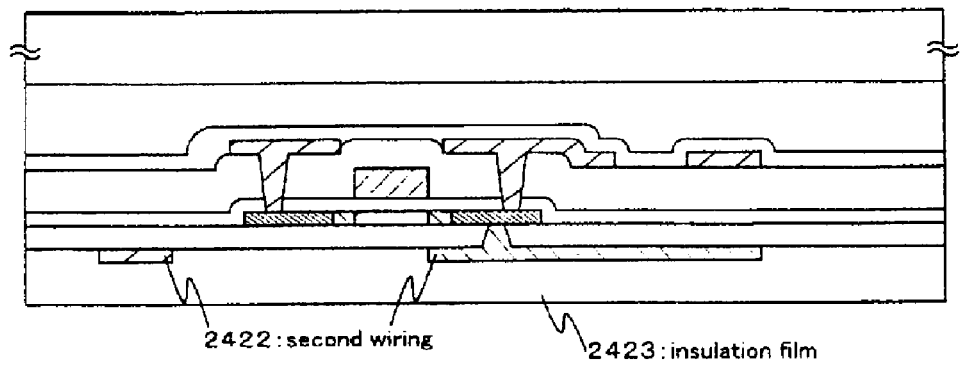

An opening portion 2421 is formed next in the lower portion insulation film 2403 in order to connect to the active layer 2408 (see FIG. 20B), and second wirings 2422 and an insulation film 2423 are formed. (See FIG. 20C.) Heat treatment of the active layer 2408 is already complete, and therefore a wiring material having a low resistance to heat can be used as the second wirings 2422. Aluminum may be used, similar to the first wirings 2417, and indium tin oxide (ITO) may also be used for cases in which the thin film device is used as a transmission type liquid crystal display device, as shown in Embodiment 4.

The thickness of the insulation film between the first wiring 2417 and the second wiring 2422 can thus be made thicker, and parasitic capacitance can be reduced, using the manufacturing of the present invention. There are no problems in forming conductive connections through the insulation film, and further, a wiring material having low heat resistance can be used. This contributes to high speed circuit operation of electric circuits and to accurate propagation of electric signals.

Embodiment 4

Figure 21:
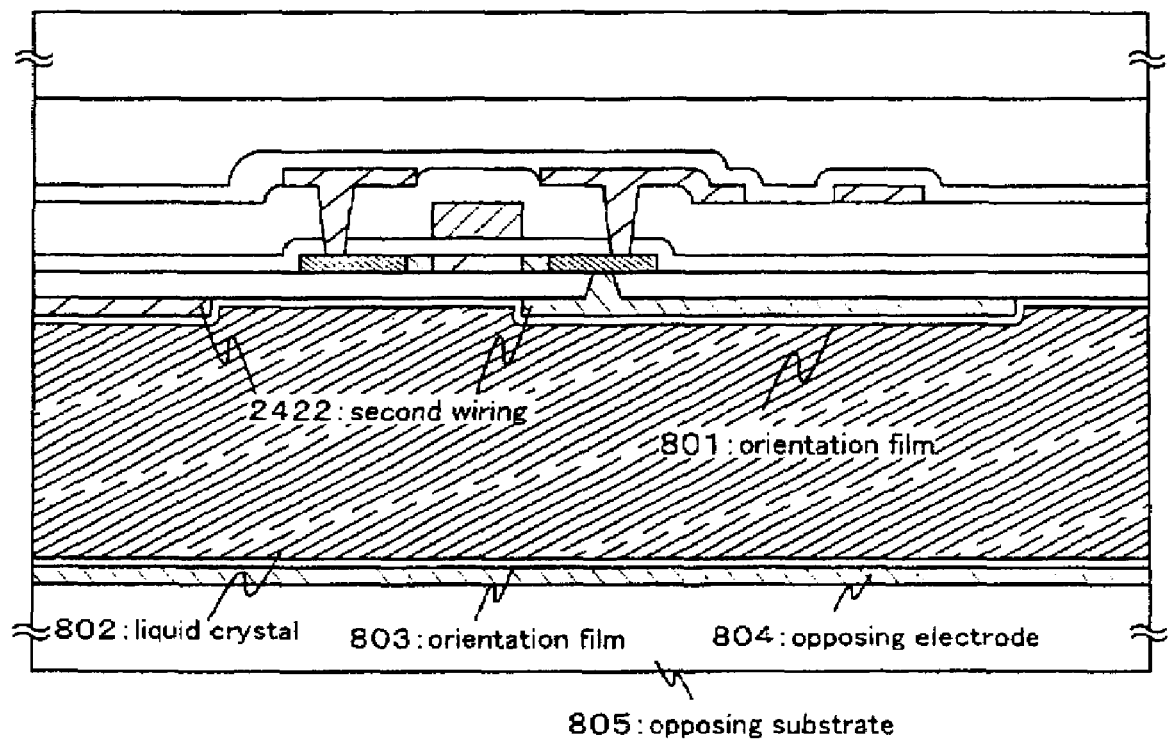
FIG. 21 is a diagram shorting an example of an embodiment of the present invention.

A process of manufacturing an active matrix liquid crystal display device from the semiconductor device manufactured by Embodiment 3 is explained in this embodiment. As shown in FIG. 21 the second wirings 2422 is formed with respect to the substrate in the state of FIG. 20B. A transparent conductive film may be used as the second wirings 2422 for cases of manufacturing a transmission type liquid crystal display device, and a metallic film may be used if a reflection type liquid crystal display device is manufactured. An indium tin oxide (ITO) film is formed by sputtering to a thickness of 110 nm here because a transmitting type liquid crystal display device is made.

An orientation film 801 is formed A polyimide film is used as the orientation film over this embodiment. Further, an opposing electrode 804 and an orientation film 803 are formed in an opposing substrate 805. Note that color filters and light shielding films may also be formed over the opposing substrate when necessary.

A rubbing process is performed after forming the orientation film 803, so as to orient liquid crystal molecules by giving them a certain, fixed, pre-tilt angle. The active matrix substrate on which the pixel portion and a driver circuit are formed (the semiconductor device manufactured in this embodiment 3) and the opposing substrate are then joined together through a sealing material, spacers (both not shown in the figures), and the like, in accordance with a known cell construction technique. Liquid crystals 802 are then injected between both of the substrates, and are completely sealed using a sealant (not shown in the figures). Known liquid crystal materials may be used for the liquid crystals. The active matrix liquid crystal display device shown in FIG. 21 is thus complete.

Figure 22:
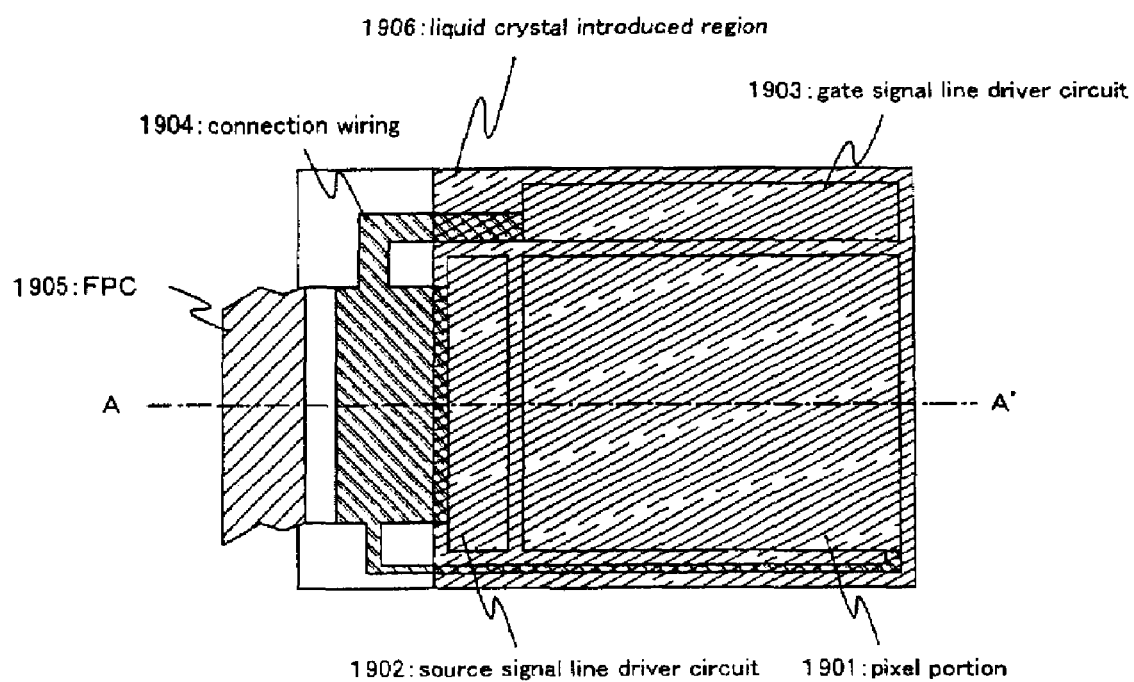
FIG. 22 is a diagram showing an example of an embodiment of the present invention.
Figure 23:
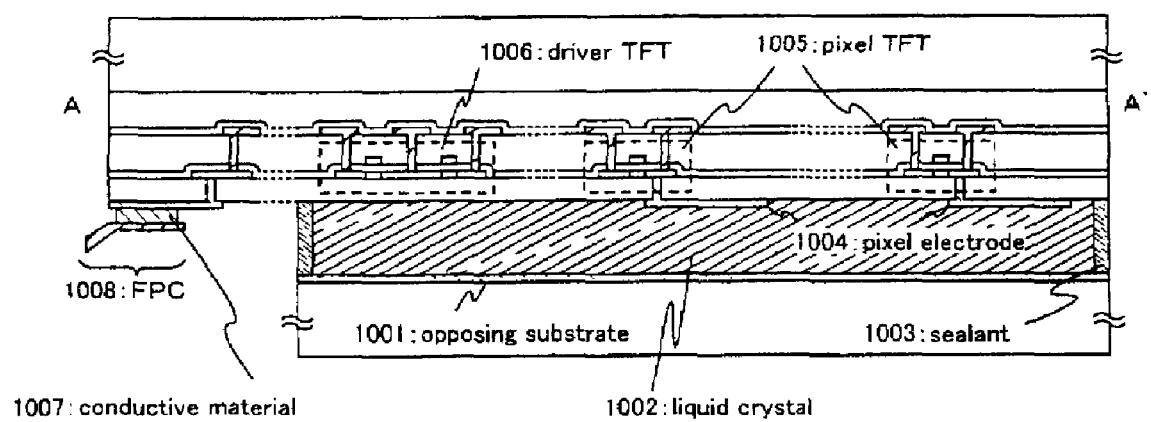
FIG. 23 is a diagram showing an example of an embodiment of the present invention.

The overall structure for a case in which a driver circuit is integrated with this active matrix liquid crystal display device is shown in FIG. 22. Note that FIG. 23 is a cross sectional diagram of FIG. 22 cut along the line A-A'. FIG. 22 is a diagram showing a state after a source signal line driver circuit 1902, a gate signal line driver circuit 1903, and transistors structuring a pixel portion 1901 are formed on a first substrate, after which a second substrate is bonded, the first substrate is removed, and liquid crystals are introduced (liquid crystal introduced region 1906), as seen from the liquid crystal side.

The liquid crystal display device shown in FIG. 22 is structured by the pixel portion 1901, the source signal line driver circuit 1902, and the gate signal line driver circuit 1903. The pixel portion 1901 is n-channel TFTs, and the driver circuits formed in the periphery are structured by CMOS circuits as basic elements. The source signal line driver circuit 1902 and the gate signal line driver circuit 1903 are connected to an FPC (flexible printer circuit) 1905 by using a connection wiring 1904, and signals from external driver circuits are received.

Liquid crystals 1002, surrounded by an opposing electrode 1001 and a sealant 1003, are below a pixel electrode 1004 connected to a pixel TFT 1005). The liquid crystals 1002 are also below a driver TFT 1006 in this case, but the liquid crystals 1002 may also be arranged only under the pixel electrode 1004 for cases when one wishes to reduce parasitic capacitance. Signals from an FPC 1008 bonded by a conductive material 1007 are input to the driver TFT 1006.

Embodiment 5

An example of applying the manufacturing method of the semiconductor device of the present invention to an active matrix type EL (electro luminescence) display device will be described.

Figure 10B:
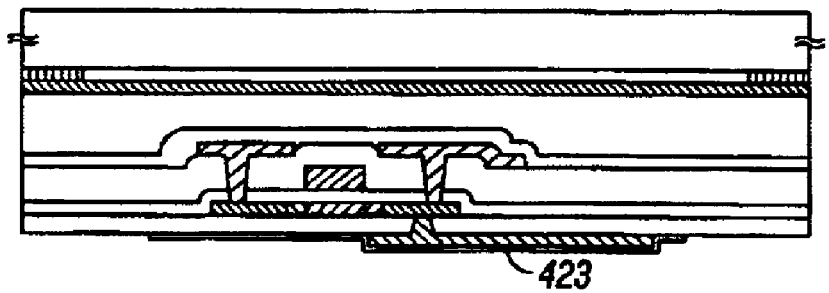
Figure 10C:
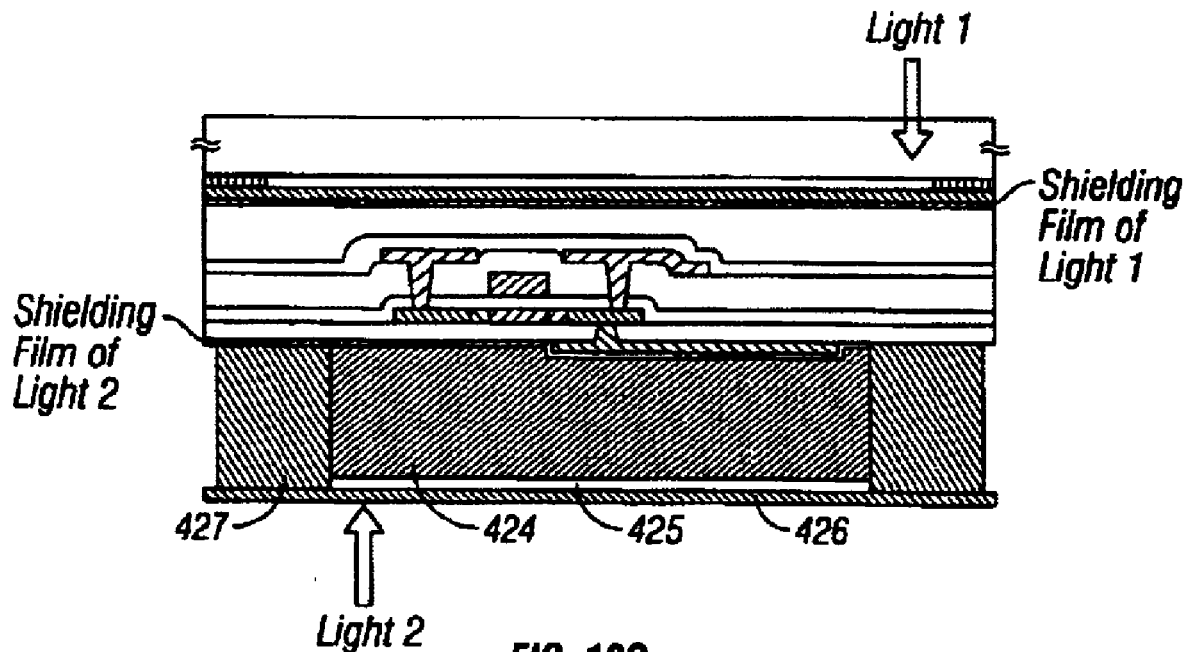
Figure 24A:
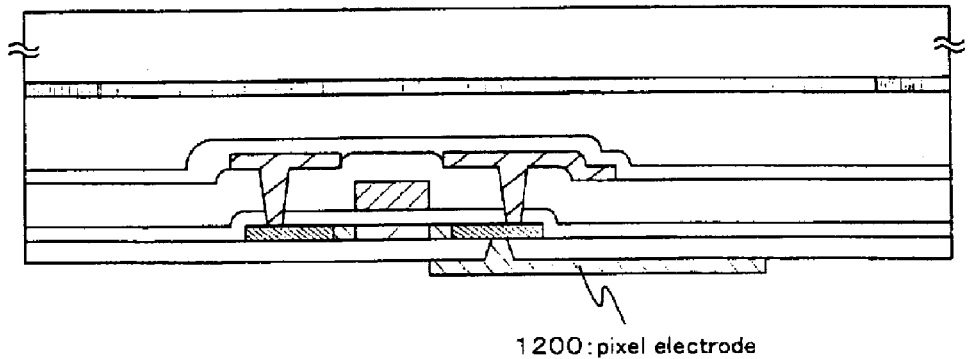
FIGS. 24A to 24C are diagrams showing an active matrix EL display device manufactured using the present invention.

The manufacturing steps are same as that till shown in FIG. 10B of Embodiment 1. However the polarized film 422 is not necessary. (FIG. 24A.) A transparent conductive film having a large work coefficient is used as the pixel electrode 1200. A chemical compound of indium oxide and tin oxide or a chemical compound of indium oxide and zinc oxide can be used as the transparent conductive film.

The fifth insulating film 1202 is then formed on the pixel electrode 1200, (below the pixel electrode in the figure) and an open portion is formed in the fifth insulating film 1202 on the pixel electrode 1200. An EL layer 1201 is formed on the pixel electrode 1200 in the open portion. Known organic EL materials and known inorganic materials can be used for the EL layer 1201. Further, low molecular weight (monomer) materials and high molecular weight (polymer) materials exist as organic EL materials, and either may be used.

A known application technique may be used as a method of forming the EL layer 1201. Further, the structure of the EL layer may be a lamination structure or a single layer structure, in which hole injecting layers, hole transporting layers, light emitting layers, electron transporting layers, and electron injecting layers are freely combined.

A cathode 1203 composed of a conducting film having light shielding properties (typically a conductive film having aluminum, copper, or silver as its main constituent, or a lamination film of these and another conductive film) is formed on the EL layer 1201 (below the EL layer in the figure). Furthermore, it is preferable to remove, as much as possible, moisture and oxygen existing in the interface between the cathode 1203 and the EL layer 1201. It is therefore necessary to employ a scheme such as forming the EL layer 1201 and the cathode 1203 in succession within a vacuum, or one in which the EL layer 1201 is formed in a nitrogen or inert gas environment, and then the cathode 1203 is formed without exposure to oxygen or moisture. It is possible to perform the above stated film formation in Embodiment 5 by using a multi-chamber method (cluster tool method) film formation apparatus.

Figure 24B:
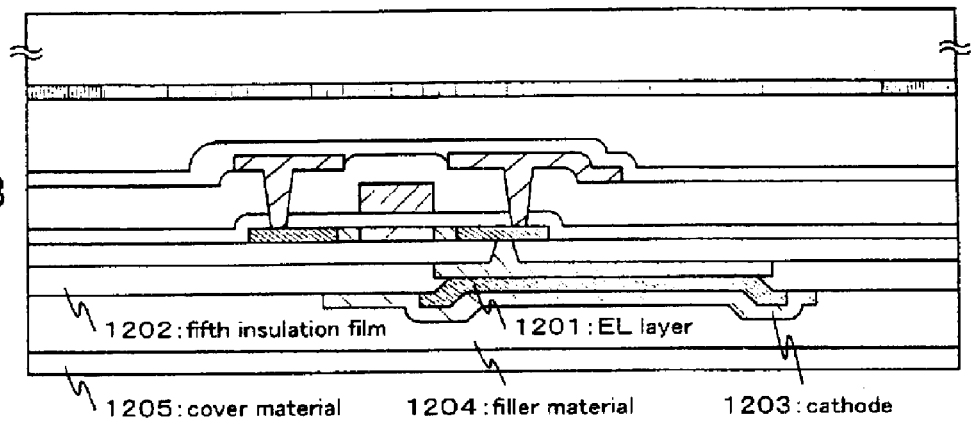

An EL element composed of the pixel electrode 1200, the EL layer 1201, and the cathode 1203 is thus formed. The EL element is enclosed by the filler material 1204. (FIG. 24B)

A glass plate, a metallic plate (typically a stainless steel material), a ceramic plate, an FRP (fiberglass reinforced plastics) plate, a PVF (polyvinyl fluoride) film, a mylar film, a polyester film, and an acrylic resin film can be used as the cover material 1205. Further, a sheet having a structure in which aluminum foil is sandwiched by a PVF film or a mylar film can also be used.

Note that, it is necessary for the cover material to be transparent for cases in which the irradiating direction of light from the EL elements is toward the cover material side. A transparent material such as a glass plate, a plastic plate, a polyester film, or an acrylic film, is used in this case.

Further, an ultraviolet hardening resin or a thermally hardening resin can be used as the filler material 1204. PVC (polyvinyl chloride), acrylic, polyimide, epoxy resin, silicon resin, PVB (polyvinyl butyral) and EVA (ethylene vinyl acetate) can be used. Deterioration of the EL elements can be suppressed if a drying agent (preferably barium oxide) is formed on the inside of the filler material 1204.

Furthermore, spacers may also be included within the filler material 1204. It is possible to give the spacers themselves moisture absorbency ban forming the spacers from barium oxide. Further, when forming spacers, it is also effective to form a resin film on the cathode 1203 as a buffer layer for relieving pressure from the spacers.

Figure 24C:
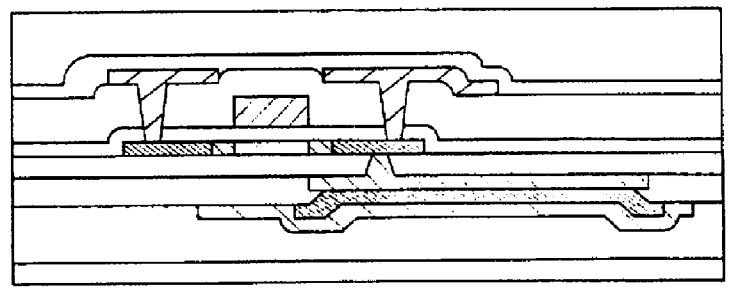

Lastly, the second substrate 419 is removed by cut a substrate same as Embodiment 1. Thin and light active matrix EL display device is thus manufactured. (FIG. 24C.)

Embodiment 6

Figure 26:
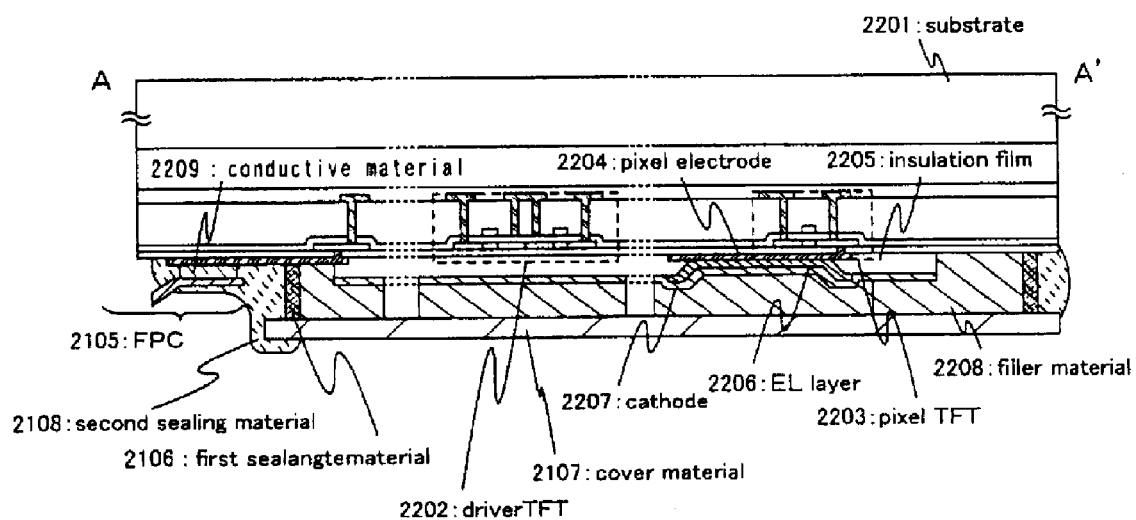
FIG. 26 is a diagram showing an active matrix EL display device manufactured using the present invention.

An example of manufacturing an EL (electro luminescence) display device using the present invention in this embodiment will be described. FIG. 35 is a diagram showing a state after a source signal line driver circuit 2102, a gate signal line driver circuit 2103, and transistors structuring a pixel portion 2101 are formed on the first substrate and, after which the second substrate is bonded, the first substrate is removed, and the EL laser is formed, as seen from the EL layer side. FIG. 26 is a cross-sectional diagram of FIG. 11 cut along the line A-A'.

Figure 25:
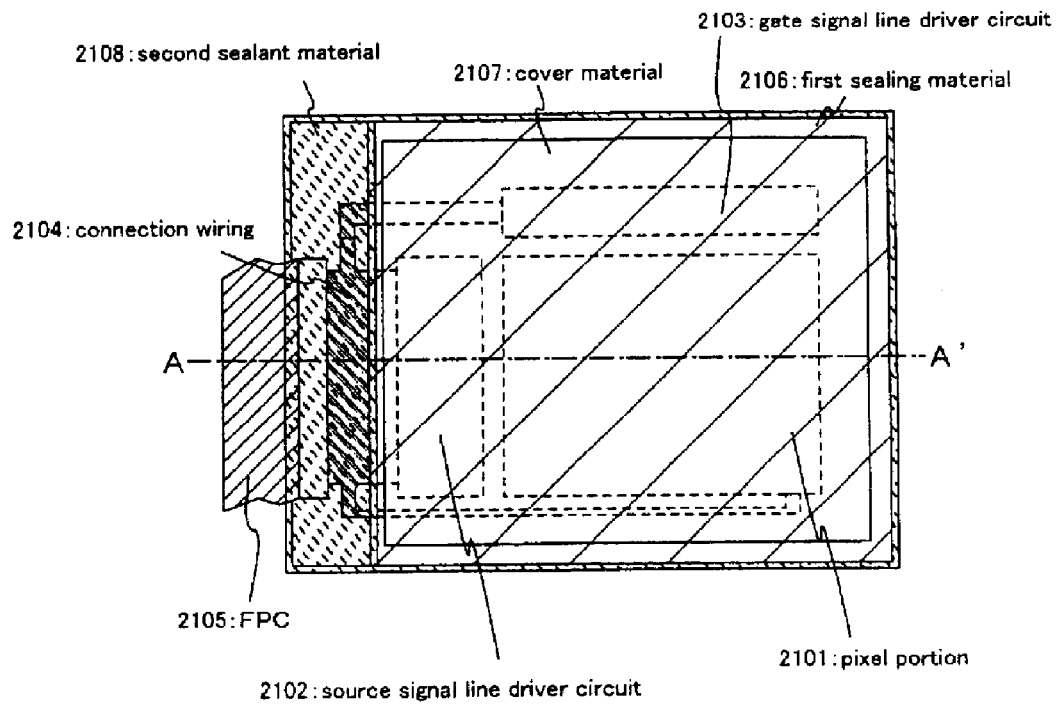
FIG. 25 is a diagram showing an active matrix EL display device manufactured using the present invention.

In FIGS. 25 and 26, reference numeral 2201 denotes a substrate, reference numeral 2101 denotes a pixel portion, reference numeral 2102 denotes a source signal line driver circuit, 2103 denotes a gate signal line driver circuit. Each of the drivel circuits is connected to an external equipment via a connection wiring 2104 leading to an FPC (flexible printed circuit) 2105.

A first sealing material 2106, a cover material 2107, a filler material 2208, and a second sealing material 2108 are formed at this point so as to surround the pixel portion 2101, the source signal line driver circuit 2102, and the gate signal line driver circuit 2103.

FIG. 26 is a cross sectional diagram corresponding to FIG. 25 cut along the line A-A'. A driver TFT 2202 (note that an n-channel TFT and a p-channel TFT are shown here) contained in the source signal line driver circuit 2102 over the substrate 2201, and a pixel TFT 2203 (a TFT for controlling the electric current flowing in an EL element is shown here) contained in the pixel portion 2101 are formed.

A pixel electrode 2204 is formed so as to electrically be connected to either a source region or a drain region of the pixel TFT 2203. A transparent conductive film having a large work coefficient is used as the pixel electrode 2204. A chemical compound of indium oxide and tin oxide or a chemical compound of indium oxide and zinc oxide can be used as the transparent conductive film.

An insulating film 2205 is then formed on the pixel electrode 2204 (below the pixel electrode in the figure) and an open portion is formed in the insulating film 2205 over the pixel electrode 2204. An EL layer 2206 is formed on the pixel electrode 2204 in the open portion. Known organic EL materials and known inorganic materials can be used for the EL layer 2206. Further, low molecular weight (monomer) materials and high molecular weight (polymer) materials exist as organic EL materials, and either may be used.

A known application technique may be used as a method of forming the EL layer 2206. Further, the structure of the EL layer may be a lamination structure or a single layer structure, in which hole injecting layers, hole transporting lasers, light emitting layers, electron transporting layers, and electron injecting layers are freely combined.

A cathode 2207 composed of a conducting film having light shielding properties (typically a conductive film having aluminum, copper, or silver as its main constituent, or a lamination film of these and another conducting film) is formed on the EL layer 2206. Furthermore, it is preferable to remove, as much as possible, moisture and oxygen existing in the interface between the cathode 2207 and the EL layer 2206. It is possible to perform the above stated film formation in Embodiment 6 by using a multi-chamber method cluster (tool method) film formation apparatus.

An EL element composed of the pixel electrode 2204, the EL layer 2206, and the cathode 2207 is thus formed. The EL element is surrounded by the cover material 2107 which is joined to the substrate 2201 by the first sealing material 2106 and the second sealing material 2108 and is enclosed by, the filler material 2208.

A glass plate, a metallic plate (typically a stainless steel plate), a ceramic plate, an FRP (fiberglass reinforced plastics) plate, a PVF (polyvinyl fluoride) film, a mylar film, a polyester film, and an acrylic resin film can be used as the cover material 2107. Further, a sheet having a structure in which aluminum foil is sandwiched by a PVF film or a mylar film can also be used.

Note that, it is necessary for the cover material to be transparent for cases in which the irradiating direction of light from the EL elements is toward the cover material side. A transparent material such as a glass plate, a plastic plate, a polyester film, or an acrylic film, is used in this case.

Further, an ultraviolet hardening resin or a thermally hardening resin can be used as the filler material 2208. PVC (polyvinyl chloride), acrylic, polyimide, epoxy resin, silicon resin, PVB (polyvinyl butyral) and EVA (ethylene vinyl acetate) can be used. Deterioration of the EL elements can be suppressed if a drying agent (preferably barium oxide) is formed on the inside of the filler material 2208.

Furthermore, spacers may also be included within the filler material 2208. It is possible to give the spacers themselves moisture absorbency by forming the spacers from barium oxide. Further, when forming spacers, it is also effective to form a resin film on the cathode 2207 as a buffer layer for relieving pressure from the spacers.

The connection wiring 2104 is electrically connected to the FPC 2105 through a conductive material 2209. The connection wiring 2104 transmits signals sent to the pixel portion 2101, the source signal line driver circuit 2102, and the gate signal line driver circuit 2103 to the FPC 2105, and the wiring is electrically connected to external equipment by the FPC 2105.

Further, the second sealing material 2108 is formed so as to cover exposed portions of the first sealing material 2106 and a portion of the FPC 2105, resulting in a structure in which the EL elements are completely cutoff from the atmosphere. This becomes the EL display device having the cross sectional structure of FIG. 26.

Embodiment 7

Figure 27:
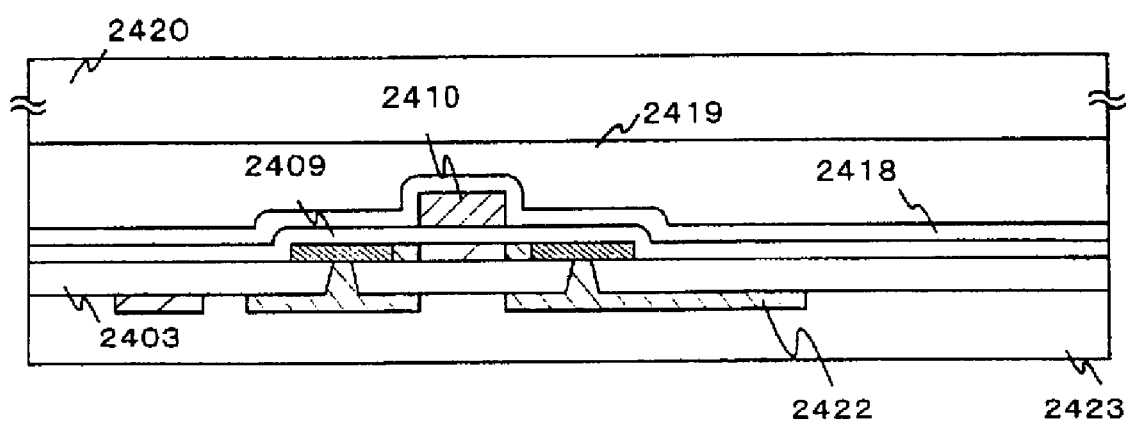
FIG. 27 is a diagram showing an example of an embodiment of the present invention.

A method of forming a bottom gate thin film transistor using the manufacturing method of the present invention is explained simply in this embodiment. A cross sectional diagram of one transistor portion is shown in FIG. 27, and the method of manufacture is basically the same as that of Embodiment 3. Note that the term bottom gate thin film transistor indicates a thin film transistor having a shape in which an active layer is formed in a layer between a gate electrode and a second wiring (the gate electrode and the wiring are not formed on the same side of the active layer), as shown in FIG. 27, in this specification.

An impurity is added to the active layer 2408 in a self aligning manner with the are electrode 2410 as a mask, similar to Embodiment 1, in FIG. 18C. The first wiring 2417 is not necessary, and therefore the passivation film 2418 and the insulation film 2419 are formed on the gate electrode 2410, thereby performing leveling. The second substrate 2420 is bonded next, the first substrate 2401 is removed, and the second wiring 2422 (denoted as the second wiring in order to be compatible with Embodiment 3, although the first wiring does not exist in this embodiment) and the insulation film in are foil formed.

A bottom gate transistor possessing a wiring and a gate electrode on opposite sides of an active layer can thus be formed. Different from a conventional bottom gate transistor, an impurity can be added in a self aligning manner.

Embodiment 8

The active matrix display device manufactured by employing the present invention may be used as a display portion of electric equipment. As such electric equipments, there are given a video camera, a digital camera, a projector, a projection TV, a goggle type display (head mount display), a navigation system, a sound reproduction device, a note type personal computer, a game device, a portable information terminal (such as a mobile computer, a cell phone, a portable type game device or an electronic book), an image playback device having a recording medium, and the like. Specific examples of such electric equipments are given in FIGS. 28A to 28F.

FIG. 8A shows a cell phone that is composed of a main body 300, a voice output portion 3002, a voice input portion 3003, a display portion 3004, operating snitches 3005, and an antenna 3006. The active matrix display device of the present invention may be used in the display portion 3004.

Figure 28A:
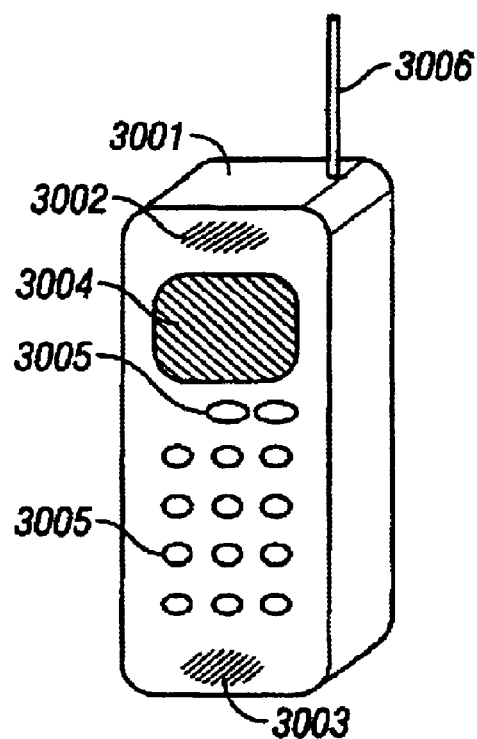
FIGS. 28A to 28F are diagrams showing examples of electronic devices.
Figure 28B:
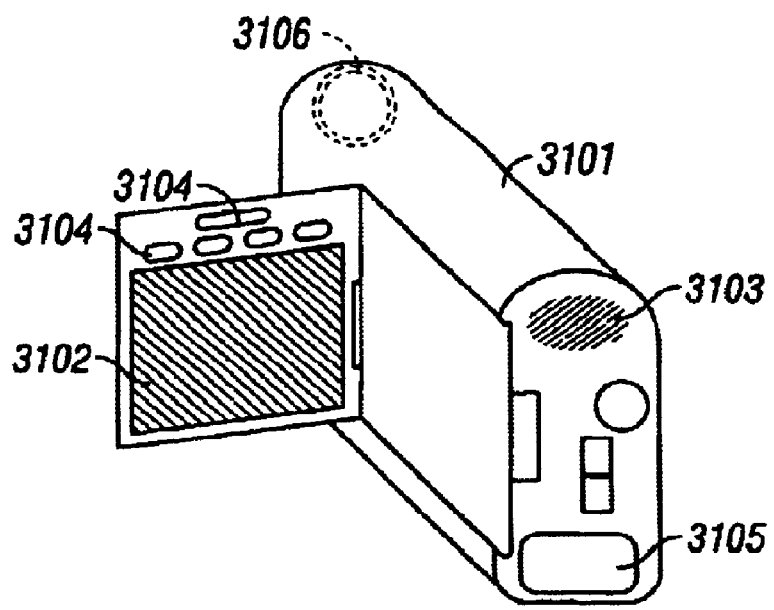

FIG. 28B shows a video camera that is composed of a main body 3101, a display portion 3102, a sound input portion 3103, operation switches 3104, a battery 3105, and an image receiving portion 3106. The active matrix display device of the present invention may be used in the display portion 3102.

Figure 28C:
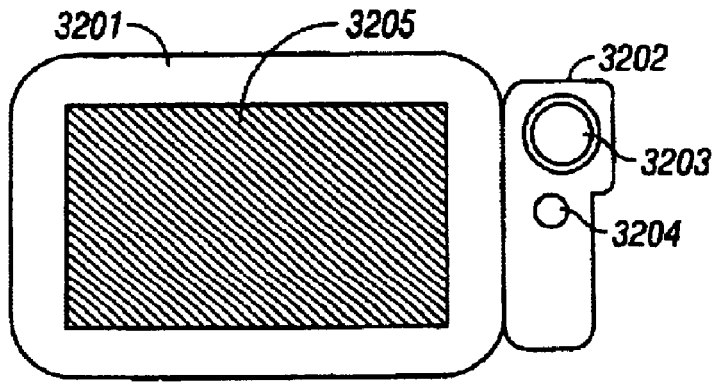

FIG. 28C shows a mobile computer that is composed of a main body 3201, a camera portion 3202, an image receiving portion 3203, an operating switch 3204 and a display portion 3205. The active matrix display device of the present invention may be used in the display portion 3205.

Figure 28D:
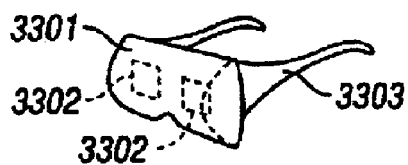

FIG. 28D shows a goggle type display that is composed of a main body 3301, display portions 3302 and arm portions 3303. The active matrix display device of the present invention may be used as the display portions 3302.

Figure 28E:
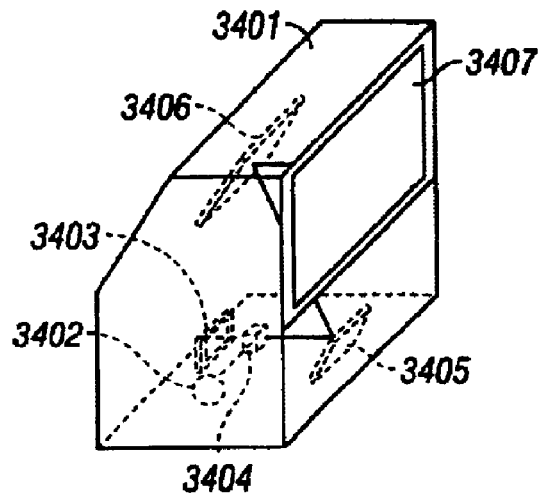

FIG. 28E shows a rear projector (projection TV) which is composed of a main body 3401, a light source 3402, a liquid crystal display device 3403, a polarized light beam splitter 3404, reflectors 3405, 3406, and a screen 3407. The present invention man be applied to the liquid crystal display device 3403.

Figure 28F:
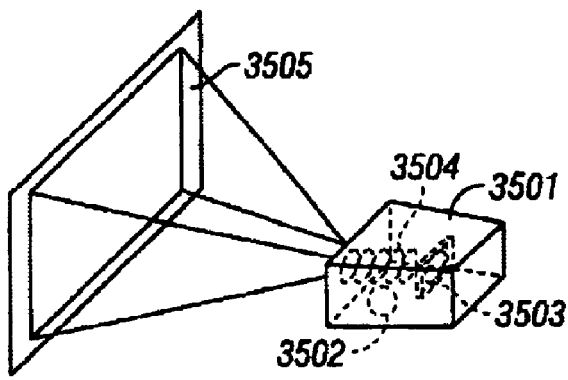

FIG. 28F shows a front projector which is composed of a main body 3501, a light source 3502, a liquid crystal display device 3503, an optical system 3504 and a screen 3505. The present invention may be applied to the liquid crystal display device 3503.

As described above, the application range of the present invention is extremely wide, and may be applied to electric equipments in all fields.

A semiconductor device can be made thinner, lighter weight, and be imparted with flexibility with the present invention. In general, the process of manufacturing a semiconductor device is complex if a substrate is made thinner, but the semiconductor device can be easily manufactured by using a suitable supporting material only during manufacture in the present invention. It is possible to apply the present invention to semiconductor devices in which circuits such as SOI structure integrated circuits, active matrix liquid crystal display devices, and active matrix EL display devices are formed on an insulator. Further, insulation films between wirings can be made thicker by using the present invention, and parasitic capacitance generating between wirings formed on different layers can be reduced. In addition, the problem of making conductive connections by forming an opening portion in an insulation film, and the problem of wiring material heat resistance when insulation films are formed thicker with a conventional structure are solved.

What is claimed is:

1. A semiconductor device comprising:
a first thin film device;
a second thin film device formed over the first thin film device;
a third thin film device formed over the second thin film device, each of the first, second, and third thin film devices comprising:
a first insulating film;
a first electrode formed over the first insulating film;
a second insulating film formed over the first electrode;
first and second thin film transistors formed over the second insulating film, wherein the first thin film transistor is connected to the first electrode through a first contact hole;
a third insulating film formed over the first and second thin film transistor;
a second electrode formed over the third insulating film, wherein the second electrode is connected to the second thin film transistor through a second contact hole; and
a fourth insulating film formed over the third insulating film and the second electrode,
wherein the second electrode of the first thin film device is electrically connected to the first electrode of the second thin film device, and wherein the second electrode of the second thin film device is electrically connected to the first electrode of the third thin film device.

2. An electric equipment having the semiconductor device according to claim 1, wherein the electric equipment is one selected from the group consisting of a cell phone, a video camera, a digital camera, a projection TV, a navigation system, a game machine, a portable type game device, a sound reproduction device, an electronic book, an image playback device having a recording medium, a mobile computer, a goggle type display, a rear projector, and a front projector.

3. A semiconductor device according to claim 1, wherein the semiconductor device is an active matrix liquid crystal display device.

4. A semiconductor device according to claim 1, wherein the semiconductor device is an EL display device.

5. A semiconductor device according to claim 1, further comprising:
   first and second conductive pastes,
   wherein the second electrode of the first thin film device is electrically connected to the first electrode of the second thin film device by the first conductive paste, and
   wherein the second electrode of the second thin film device is electrically connected to the first electrode of the third thin film device by the second conductive paste.

6. A semiconductor device according to claim 1, wherein the first insulating film is a passivation film.

7. A semiconductor device according to claim 1, wherein the first thin film device is overlapped with the second thin film device and the third thin film device.

8. A semiconductor device comprising:
   a first thin film device;
   a second thin film device formed over the first thin film device;
   a third thin film device formed over the second thin film device, each of the first, second, and third thin film devices comprising:
      a first insulating film comprising an organic resin;
      a second insulating film formed over the first insulating film;
      a first electrode formed over the second insulating film;
      a third insulating film formed over the first electrode;
      first and second thin film transistors formed over the third insulating film, wherein the first thin film transistor is connected to the first electrode through a first contact hole;
      a fourth insulating film formed over the first and second thin film transistor;
      a second electrode formed over the fourth insulating film, wherein the second electrode is connected to the second thin film transistor through a second contact hole;
      a fifth insulating film formed over the fourth insulating film and the second electrode; and
      a sixth insulating film comprising an organic resin formed over the fifth insulating film,
   wherein the second electrode of the first thin film device is electrically connected to the first electrode of the second thin film device, and
   wherein the second electrode of the second thin film device is electrically connected to the first electrode of the third thin film device.

9. An electric equipment having the semiconductor device according to claim 8, wherein the electric equipment is one selected from the group consisting of a cell phone, a video camera, a digital camera, a projection TV, a navigation system, a game machine, a portable type game device, a sound reproduction device, an electronic book, an image playback device having a recording medium, a mobile computer, a goggle type display, a rear projector, and a front projector.

10. A semiconductor device according to claim 8, wherein the semiconductor device is an active matrix liquid crystal display device.

11. A semiconductor device according to claim 8, wherein the semiconductor device is an EL display device.

12. A semiconductor device according to claim 8, further comprising:
    first and second conductive pastes,
    wherein the second electrode of the first thin film device is electrically connected to the first electrode of the second thin film device by the first conductive paste, and
    wherein the second electrode of the second thin film device is electrically connected to the first electrode of the third thin film device by the second conductive paste.

13. A semiconductor device according to claim 8, wherein the second insulating film is a passivation film.

14. A semiconductor device according to claim 8, wherein the first thin film device is overlapped with the second thin film device and the third thin film device.

* * * * *